US012742116B2

(12) United States Patent
Lee et al.

(10) Patent No.: US 12,742,116 B2
(45) Date of Patent: Sep. 22, 2026

(54) QUANTUM DOT DEVICE AND ELECTRONIC DEVICE

(71) Applicant: SAMSUNG ELECTRONICS CO., LTD., Suwon-si (KR)

(72) Inventors: Heejae Lee, Seongnam-si (KR); Soonmin Cha, Suwon-si (KR); Tae Hyung Kim, Seoul (KR); Dae-Hee Lee, Hwaseong-si (KR); Eun Joo Jang, Suwon-si (KR); Hyo Sook Jang, Suwon-si (KR); Dae Young Chung, Suwon-si (KR); Moon Gyu Han, Suwon-si (KR)

(73) Assignees: SAMSUNG ELECTRONICS CO., LTD., Gyeonggi-Do (KR); SAMSUNG DISPLAY CO., LTD., Gyeonggi-Do (KR)

( * ) Notice: Subject to any disclaimer, the term of this patent is extended or adjusted under 35 U.S.C. 154(b) by 1077 days.

(21) Appl. No.: 17/705,617

(22) Filed: Mar. 28, 2022

(65) Prior Publication Data

US 2022/0325178 A1 Oct. 13, 2022

(30) Foreign Application Priority Data

Mar. 30, 2021 (KR) ........................ 10-2021-0041122
Mar. 28, 2022 (KR) ........................ 10-2022-0037747

(51) Int. Cl.
*H10K 50/115* (2023.01)
*C09K 11/56* (2006.01)
(Continued)

(52) U.S. Cl.
CPC .......... *C09K 11/565* (2013.01); *C09K 11/883* (2013.01); *B82Y 20/00* (2013.01);
(Continued)

(58) Field of Classification Search
CPC ...... H10K 50/115; H10K 50/14; H10K 50/15; H10K 50/155; H10K 50/156;
(Continued)

(56) References Cited

U.S. PATENT DOCUMENTS 9,905,790 B2 2/2018 Koh et al.
10,991,899 B2 4/2021 Kim et al.
(Continued)

FOREIGN PATENT DOCUMENTS

CN 106654027 A 5/2017
CN 111162183 A 5/2020
(Continued)

OTHER PUBLICATIONS

Extended European Search Report dated Sep. 5, 2022, of the corresponding European Patent Application No. 22164642.5.
(Continued)

*Primary Examiner* — Eric A. Ward
(74) *Attorney, Agent, or Firm* — CANTOR COLBURN LLP

(57) ABSTRACT

A quantum dot device and an electronic device. The quantum dot device includes a first electrode and a second electrode, a light emitting layer disposed between the first electrode and the second electrode and including quantum dots, a first charge auxiliary layer disposed between the second electrode and the light emitting layer and enhancing transport of first charge carriers from the second electrode to the light emitting layer, and a buffer layer disposed between the light emitting layer and the first charge auxiliary layer and enhancing extraction of second charge carriers from the light emitting layer.

26 Claims, 1 Drawing Sheet

(51) Int. Cl.

| | |
|---|---|
| ***C09K 11/88*** | (2006.01) |
| *B82Y 20/00* | (2011.01) |
| *B82Y 40/00* | (2011.01) |
| *H10K 50/11* | (2023.01) |
| *H10K 50/15* | (2023.01) |
| *H10K 50/16* | (2023.01) |
| *H10K 71/40* | (2023.01) |
| *H10K 101/30* | (2023.01) |
| *H10K 101/40* | (2023.01) |
| *H10K 102/00* | (2023.01) |

(52) U.S. Cl.
CPC ............... *B82Y 40/00* (2013.01); *H10K 50/11* (2023.02); *H10K 50/115* (2023.02); *H10K 50/15* (2023.02); *H10K 50/16* (2023.02); *H10K 71/40* (2023.02); *H10K 2101/30* (2023.02); *H10K 2101/40* (2023.02); *H10K 2102/00* (2023.02)

(58) Field of Classification Search
CPC .... H10K 50/157; H10K 50/16; H10K 50/165; H10K 50/166; H10K 50/167; H10K 50/18; H10K 50/181
See application file for complete search history.

(56) References Cited

U.S. PATENT DOCUMENTS

| | | | | |
|---|---|---|---|---|
| 11,011,673 | B2 | 5/2021 | Park et al. | |
| 11,063,231 | B2 | 7/2021 | Chung et al. | |
| 11,127,912 | B2 | 9/2021 | Seo et al. | |
| 11,127,913 | B2 | 9/2021 | Woo et al. | |
| 12,040,429 | B2 | 7/2024 | Ueta | |
| 2017/0373266 | A1* | 12/2017 | Xu | H10K 50/16 |
| 2018/0006224 | A1* | 1/2018 | Lee | H10K 85/6572 |
| 2020/0168827 | A1 | 5/2020 | Woo et al. | |
| 2020/0227663 | A1 | 7/2020 | Kim et al. | |
| 2020/0313108 | A1 | 10/2020 | Jang et al. | |
| 2021/0043864 | A1* | 2/2021 | Li | H10K 50/171 |
| 2022/0020898 | A1* | 1/2022 | Ueta | H05B 33/14 |

FOREIGN PATENT DOCUMENTS

| | | | |
|---|---|---|---|
| CN | 111224006 | A | 6/2020 |
| CN | 111435710 | A | 7/2020 |
| CN | 112054127 | A | 12/2020 |
| KR | 20160039779 | A | 4/2016 |
| KR | 20160047296 | A | 5/2016 |
| KR | 20170048965 | A | 5/2017 |
| KR | 1859123 | B1 | 5/2018 |
| KR | 20200008976 | A | 1/2020 |
| KR | 20200011302 | A | 2/2020 |
| KR | 20200039605 | A | 4/2020 |
| KR | 20200059651 | A | 5/2020 |
| KR | 20200061044 | A | 6/2020 |
| KR | 20200088695 | A | 7/2020 |
| KR | 20200115798 | A | 10/2020 |
| WO | 2020121381 | A1 | 6/2020 |

OTHER PUBLICATIONS

Office Action dated Oct. 17, 2025 of the corresponding Korean Patent Application No. 10-2022-0037747.

Office Action dated Apr. 21, 2026, of the corresponding Chinese Patent Application No. 202210319636.7.

Notice of Allowance dated Aug. 19, 2026 of the corresponding Korean Patent Application No. 10-2022-0037747.

* cited by examiner

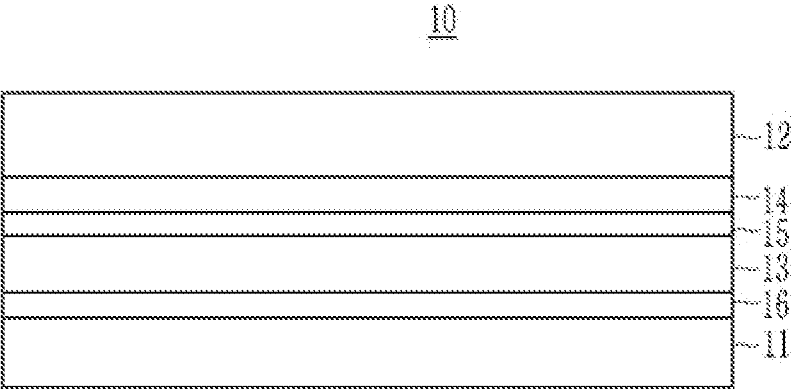
10
12
14
15
13
16
11

QUANTUM DOT DEVICE AND ELECTRONIC DEVICE

CROSS-REFERENCE TO RELATED APPLICATION

This application claims priority to and the benefit of Korean Patent Applications Nos. 10-2021-0041122 and 10-2022-0037747 filed in the Korean Intellectual Property Office on Mar. 30, 2021, and Mar. 28, 2022, respectively, and all the benefits accruing therefrom under 35 U.S.C. § 119, the content of which in its entirety is herein incorporated by reference.

BACKGROUND

1. Field

A quantum dot device and an electronic device are disclosed.

2. Description of the Related Art

Semiconductor nanocrystals also known as quantum dots may be configured to emit light of a wavelength corresponding to sizes of the quantum dots when supplied with photoenergy or electrical energy. Accordingly, the quantum dots may be used as a light emitter emitting light of a particular wavelength.

Research on a quantum dot device using the quantum dots as a light emitter is of recent interest, and thus a new method of improving the performance of a quantum dot device is of importance.

SUMMARY

An embodiment provides a quantum dot device capable of realizing, e.g., exhibiting, improved performance.

An embodiment provides an electronic device including the quantum dot device.

According to an embodiment, a quantum dot device includes a first electrode and a second electrode, a light emitting layer between the first electrode and the second electrode, the light emitting layer including quantum dots, a first charge auxiliary layer between the second electrode and the light emitting layer, the first charge auxiliary layer configured to enhance transport of first charge carriers from the second electrode to the light emitting layer, and a buffer layer between the light emitting layer and the first charge auxiliary layer, the buffer layer configured to enhance extraction of second charge carriers from the light emitting layer.

One of the first charge carriers and the second charge carriers may be electrons and the other of the first charge carriers and the second charge carriers may be holes. The first charge carriers may be major charge carriers between the second electrode and the light emitting layer and the second charge carriers may be minor charge carriers between the second electrode and the light emitting layer.

The buffer layer may be in contact with the light emitting layer.

The first charge auxiliary layer and the buffer layer may be in contact with each other.

The buffer layer may include a first charge auxiliary material configured to enhance transport of the first charge carriers and a second charge auxiliary material configured to enhance extraction of the second charge carriers, wherein a highest occupied molecular orbital (HOMO) energy level of the second charge auxiliary material may be lower, e.g., shallower, than a HOMO energy level of the first charge auxiliary material.

The HOMO energy level of the second charge auxiliary material may be about 0.1 electronvolts (eV) to about 3.0 eV lower, e.g., shallower, than the HOMO energy level of the first charge auxiliary material.

The first charge auxiliary material may be a first electron transport material, and the second charge auxiliary material may be a hole extraction material.

The first charge auxiliary material may include n-type inorganic nanoparticles, and the second charge auxiliary material may include a p-type non-polymer, a p-type polymer, a p-type inorganic material, a p-type organic-inorganic material, or a combination thereof.

A conductivity of the second charge carriers of the second charge auxiliary material may be greater than a conductivity of the second charge carriers of the first charge auxiliary material.

The second charge auxiliary material may be present in a lesser amount than the first charge auxiliary material in the buffer layer.

In the buffer layer, the second charge auxiliary material may be present in an amount of about 0.1 weight percent (wt %) to about 15 wt %, based on a total amount of the first charge auxiliary material and the second charge auxiliary material.

The first charge auxiliary layer may include a second electron transport material, the second electron transport material being the same as or different from the first electron transport material.

The thickness of the buffer layer may be the same as or thinner than a thickness of the first charge auxiliary layer.

A conductivity of the second charge carriers of the buffer layer may be greater than a conductivity of the second charge carriers of the first charge auxiliary layer, and a conductivity of the second charge carriers of the buffer layer may be greater than a conductivity of the second charge carriers of the light emitting layer.

The quantum dot device may further include a second charge auxiliary layer between the first electrode and the light emitting layer, the second charge auxiliary layer configured to enhance transport of the second charge carriers from the first electrode to the light emitting layer, wherein the second charge carriers may be major charge carriers between the first electrode and the light emitting layer.

According to an embodiment, a quantum dot device includes a first electrode and a second electrode, a light emitting layer between the first electrode and the second electrode, the light emitting layer including quantum dots, a buffer layer between the second electrode and the light emitting layer, the buffer layer including a first electron transport material and a hole extraction material, and a first charge auxiliary layer between the second electrode and the light emitting layer, the first charge auxiliary layer including a second electron transport material that is the same as or different from the first electron transport material, wherein the buffer layer is closer to the light emitting layer than the first charge auxiliary layer.

The hole extraction material may be present in a lesser amount than the first electron transport material in the buffer layer.

The first electron transport material, the hole extraction material, the second electron transport material, or a combination thereof may include inorganic nanoparticles.

A hole conductivity of the buffer layer may be greater than a hole conductivity of the first charge auxiliary layer, and a hole conductivity of the buffer layer may be greater than a hole conductivity of the light emitting layer.

The quantum dot device may further include a second charge auxiliary layer between the first electrode and the light emitting layer, the second charge auxiliary layer including a hole transport material.

According to an embodiment, a quantum dot device includes a first electrode and a second electrode, a light emitting layer between the first electrode and the second electrode, the light emitting layer including quantum dots, a first charge auxiliary layer between the second electrode and the light emitting layer, and a buffer layer between the light emitting layer and the first charge auxiliary layer, wherein a hole conductivity of the buffer layer is greater than a hole conductivity of the first charge auxiliary layer, and wherein a hole conductivity of the buffer layer is greater than a conductivity of the light emitting layer.

The first electrode may be an anode, the second electrode may be a cathode, and the buffer layer may include a hole extraction material.

The buffer layer may further include n-type inorganic nanoparticles.

The first charge auxiliary layer and the buffer layer may each include the same or different n-type inorganic nanoparticles.

According to an embodiment, an electronic device including the quantum dot device is provided.

According to an embodiment, a quantum dot device includes a first electrode and a second electrode, a light emitting layer between the first electrode and the second electrode, the light emitting layer comprising quantum dots, a charge auxiliary layer between the second electrode and the light emitting layer, the charge auxiliary layer comprising an alkali metal compound and metal oxide nanoparticles comprising zinc, and a buffer layer between the light emitting layer and the charge auxiliary layer, the buffer layer comprising the metal oxide nanoparticles comprising zinc and a hole extraction material selected from a p-type non-polymer, a p-type polymer, a p-type inorganic material, a p-type organic-inorganic material, or a combination thereof.

The performance of quantum dot devices may be improved.

BRIEF DESCRIPTION OF THE DRAWINGS

The above and other advantages and features of this disclosure will become more apparent by describing in further detail exemplary embodiments thereof with reference to the accompanying drawings, in which: the FIGURE is a schematic cross-sectional view illustrating a quantum dot device according to an embodiment.

DETAILED DESCRIPTION

Hereinafter, embodiments of the present disclosure will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. It will be understood that, although the terms "first," "second," "third," etc. may be used herein to describe various elements, components, regions, layers, and/or sections, these elements, components, regions, layers and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" and "upper," may be used herein to describe one element's relationship to another element as illustrated in the FIGURES. It will be understood that relative terms are intended to encompass different orientations of the device in addition to the orientation depicted in the FIGURES. For example, if the device in one of the FIGURES is turned over, elements described as being on the "lower" side of other elements would then be oriented on "upper" sides of the other elements. The exemplary term "lower," can therefore, encompasses both an orientation of "lower" and "upper," depending on the particular orientation of the FIGURE. Similarly, if the device in one of the FIGURES is turned over, elements described as "below" or "beneath" other elements would then be oriented "above" the other elements. The exemplary terms "below" or "beneath" can, therefore, encompass both an orientation of above and below.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims. Hereinafter, the term "combination" includes a mixture or a laminated structure of two or more.

As used herein, when specific definition is not otherwise provided, an energy level refers to the highest occupied molecular orbital (HOMO) energy level and the lowest unoccupied molecular orbital (LUMO) energy level.

Hereinafter, a work function (WF), a HOMO energy level, or a LUMO energy level is expressed as an absolute value from a vacuum level. In addition, when the work function, HOMO energy level, or LUMO energy level is referred to be deep, high, or large, it may have a large absolute value based on "0 eV" of the vacuum level while when the work function, HOMO energy level, or LUMO energy level is referred to be shallow, low, or small, it may have a small absolute value based on "0 eV" of the vacuum level.

The HOMO energy level and work function may be measured by ultraviolet photoelectron spectroscopy (UPS), and the LUMO energy level may be calculated from the bandgap energy obtained at the absorption peak and the HOMO energy level.

As used herein, the expression that "not including cadmium (or other harmful heavy metal)" refers to the case in which a concentration of the cadmium (or the harmful heavy metal) may be less than or equal to about 100 parts per million by weight (ppmw), less than or equal to about 50 ppmw, less than or equal to about 10 ppmw, or almost zero. In an embodiment, substantially no amount of the cadmium (or other heavy metal) may be present or, if present, an amount of the cadmium (or other heavy metal) may be less than or equal to a detection limit or as an impurity level of a given analysis tool.

As used herein, "Group" in terms of Group II, Group III, etc. refers to a group of the periodic table of elements.

As used herein, "Group I" may refer to Group IA and Group IB and examples of the Group I element may be Li, Na, K, Rb, or Cs but are not limited thereto.

As used herein, "Group II" may refer to Group IIA and Group IIB, and examples of Group II metal may be Cd, Zn, Hg, and Mg, but are not limited thereto.

As used herein, "Group III" may refer to Group IIIA and Group IIIB, and examples of Group III metal may be Al, In, Ga, and TI, but are not limited thereto.

As used herein, "Group IV" may refer to Group IVA and Group IVB, and examples of a Group IV metal may be Si, Ge, and Sn, but are not limited thereto. As used herein, the term "metal" may include a semi-metal such as Si.

As used herein, "Group V" may refer to Group VA, and examples may include nitrogen, phosphorus, arsenic, antimony, and bismuth, but are not limited thereto.

As used herein, "Group VI" may refer to Group VIA, and examples may include sulfur, selenium, and tellurium, but are not limited thereto.

Hereinafter, a quantum dot device according to an embodiment is described with reference to the drawings.

The quantum dot device according to an embodiment may be a quantum dot electroluminescent device that emits light from the quantum dot by applying an electric field to electrodes.

FIG. 1 is a schematic cross-sectional view illustrating a quantum dot device according to an embodiment.

Referring to FIG. 1, a quantum dot device 10 according to an embodiment includes a first electrode 11 and a second electrode 12 facing each other; a light emitting layer 13 between the first electrode 11 and the second electrode 12; a first charge auxiliary layer 14 between the second electrode 12 and the light emitting layer 13; a buffer layer 15 between the second electrode 12 and the light emitting layer 13; and a second charge auxiliary layer 16 between the first electrode 11 and the light emitting layer 13. The buffer layer 15 may be closer to the light emitting layer 13 than is the first charge auxiliary layer 14.

The substrate (not shown) may be disposed under the first electrode 11 or may be disposed on the second electrode 12. The substrate may be, for example, made of an inorganic material such as glass; an organic material such as polycarbonate, polymethylmethacrylate, polyethylene terephthalate, polyethylene naphthalate, polyamide, polyethersulfone, or a combination thereof; or a silicon wafer. The substrate may be omitted.

One of the first electrode 11 and the second electrode 12 is an anode and the other is a cathode. For example, the first electrode 11 may be an anode and the second electrode 12 may be a cathode. For example, the first electrode 11 may be a cathode and the second electrode 12 may be an anode.

The first electrode 11 may be made of a conductor having a relatively high work function, for example, a metal, a conductive metal oxide, or a combination thereof. The first electrode 11 may be made of, for example, a metal or an alloy thereof such as nickel, platinum, vanadium, chromium, copper, zinc, or gold; a conductive metal oxide such as zinc oxide, indium oxide, tin oxide, indium tin oxide (ITO), indium zinc oxide (IZO), or a fluorine-doped tin oxide; or a combination of metal and oxide such as ZnO and Al or $SnO_2$ and Sb, but is not limited thereto.

The second electrode 12 may be made of a conductor having a lower work function than the first electrode 11, and may be made of, for example, a metal, a conductive metal oxide, a conductive polymer, or a combination thereof. The second electrode 12 may include, for example, a metal such as aluminum, magnesium, calcium, sodium, potassium, titanium, indium, yttrium, lithium, gadolinium, silver, tin, lead, cesium, barium, or an alloy thereof; and a multilayer structure material such as LiF/Al, $Li_2O$/Al, 8-quinolinolato lithium (Liq)/Al, LiF/Ca, and $BaF_2$/Ca, but is not limited thereto.

A work function of the first electrode 11 may be greater than a work function of the second electrode 12, for example the work function of the first electrode 11 may be, for example, about 4.5 eV to about 5.0 eV and the work function of the second electrode 12 may be about 4.0 eV to about 4.7 eV. Within the disclosed range, the work function of the first electrode 11 may be, for example, about 4.6 eV to about 4.9 eV, and the work function of the second electrode 12 may be, for example, about 4.0 eV to about 4.5 eV.

The first electrode 11, the second electrode 12, or a combination thereof may be a light-transmitting electrode and the light-transmitting electrode may be for example made of a conductive oxide such as a zinc oxide, indium oxide, tin oxide, indium tin oxide (ITO), indium zinc oxide (IZO), or fluorine doped tin oxide, or a metal thin layer of a single layer or a multilayer. The first electrode 11 or the second electrode 12 may be an opaque electrode, and the opaque electrode may be made of, for example, an opaque conductor such as aluminum (Al), silver (Ag), or gold (Au).

The light emitting layer 13 includes a quantum dot (quantum dots, hereinafter referred to as "quantum dot") as a light emitter configured to emit light by an electric field. The quantum dot means a semiconductor nanocrystal in a broad sense, and may exhibit a quantum confinement effect. The quantum dot may have any suitable shape, and is not particularly limited. In one non-limiting example, the quantum dot may have various shapes, such as a spherical semiconductor nanocrystal, a quantum rod, a quantum plate, or a combination thereof. The quantum rod may mean a quantum dot having an aspect ratio greater than about 1:1, for example, an aspect ratio of greater than or equal to about 2:1, greater than or equal to about 3:1, or greater than or equal to about 5:1. For example, an aspect ratio of the quantum rod may be less than or equal to about 50:1, less than or equal to about 30:1, or less than or equal to about 20:1.

The quantum dot may have, for example an (average) size, for example, a particle diameter (an average largest particle diameter (size) for a non-spherical shape) of about 1 nanometer (nm) to about 100 nm, about 1 nm to about 80 nm, about 1 nm to about 50 nm, or about 1 nm to about 20 nm. In an example, the (average) size of the quantum dot(s) may be greater than or equal to about 1 nm, greater than or equal to about 2 nm, greater than or equal to about 3 nm, greater than or equal to about 4 nm, greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, or greater than or equal to about 12 nm. In an example, the (average) size of the quantum dot(s) may be less than or equal to about 50 nm, less than or equal to about 40 nm, less than or equal to about 30 nm, less than or equal to about 25 nm, less than or equal to about 20 nm, less than or equal to about 19 nm, less than or equal to about 18 nm, less than or equal to about 17 nm, less than or equal to about 16 nm, or less than or equal to about 15 nm. For example, the average size of quantum dots (e.g., emitting blue light) may be, for example, less than or equal to about 4.5 nm, for example, less than or equal to about 4.3 nm, less than or equal to about 4.2 nm, less than or equal to about 4.1 nm, or less than or equal to about 4.0 nm. In an example, the (average) size of the quantum dot may be about 2.0 nm to about 4.5 nm, about 2.0 nm to about 4.3 nm, about 2.0 nm to about 4.2 nm, about 2.0 nm to about 4.1 nm, or about 2.0 nm to about 4.0 nm.

A bandgap energy of a quantum dot may be adjusted by varying a size, composition, or a combination thereof of the quantum dot, and the emission wavelength may be adjusted accordingly. For example, as the size of the quantum dot increases, the bandgap energy may decrease, e.g., become narrower, and thus, light of a relatively long wavelength spectrum may be emitted. As the size of the quantum dot decreases, the bandgap energy may increase, e.g., become wider, and thus light of a relatively short wavelength spectrum may be emitted.

For example, the quantum dot may be configured to emit light of, for example, a predetermined wavelength spectrum among the visible region according to their size, composition, or a combination thereof. For example, quantum dots may be configured to emit blue light, red light or green light, blue light may have a peak emission wavelength, for example in a region of about 430 nm to about 480 nm, red light may have a peak emission wavelength in about 600 nm to about 670 nm, and green light may have a peak emission wavelength in a region of about 500 nm to about 560 nm.

In the quantum dot device 10 of an example, a maximum emission wavelength of the light emitting layer 13 may be greater than or equal to about 300 nm, greater than or equal to about 400 nm, greater than or equal to about 430 nm, greater than or equal to about 450 nm, for example, greater than or equal to about 500 nm, greater than or equal to about 510 nm, greater than or equal to about 520 nm, greater than or equal to about 530 nm, greater than or equal to about 540 nm, greater than or equal to about 550 nm, greater than or equal to about 560 nm, greater than or equal to about 570 nm, greater than or equal to about 580 nm, greater than or equal to about 590 nm, greater than or equal to about 600 nm, or greater than or equal to about 610 nm. The maximum emission wavelength of the quantum dot may be in the range of less than or equal to about 800 nm, less than or equal to about 780 nm, less than or equal to about 750 nm, for example, less than or equal to about 700 nm, less than or equal to about 670 nm, less than or equal to about 650 nm, less than or equal to about 640 nm, less than or equal to about 630 nm, less than or equal to about 620 nm, less than or equal to about 610 nm, less than or equal to about 600 nm, less than or equal to about 590 nm, less than or equal to about 580 nm, less than or equal to about 570 nm, less than or equal to about 560 nm, less than or equal to about 550 nm, or less than or equal to about 540 nm. The maximum emission wavelength of the quantum dots may be in the range of about 430 nm to about 670 nm.

In the quantum dot device 10 of an example, the light emitting layer 13 or quantum dot(s) may be configured to emit green light, and the maximum emission wavelength may be in the range of greater than or equal to about 500 nm (e.g., greater than or equal to about 510 nm or greater than or equal to about 520 nm) and less than or equal to about 560 nm (e.g., less than or equal to about 550 nm or less than or equal to about 540 nm). In the quantum dot device 10 of an example, the light emitting layer 13 or quantum dot(s) may be configured to emit red light and the maximum emission wavelength may be in the range of greater than or equal to about 600 nm (e.g., may be greater than or equal to about 610 nm) and less than or equal to about 670 nm (e.g., less than or equal to about 650 nm or less than or equal to about 640 nm). In the quantum dot device 10 of an example, the light emitting layer 13 or quantum dot(s) may be configured to emit blue light and the maximum emission wavelength may be in the range of greater than or equal to about 430 nm (e.g., greater than or equal to about 440 nm or greater than or equal to about 450 nm) and less than or equal to about 480 nm (e.g., less than or equal to about 470 nm or less than or equal to about 465 nm).

The quantum dot may have a quantum yield of greater than or equal to about 10%, for example, greater than or equal to about 20%, greater than or equal to about 30%, greater than or equal to about 50%, greater than or equal to about 60%, greater than or equal to about 70%, or greater than or equal to about 90%.

The emission spectrum of the quantum dot may have a relatively narrow full width at half maximum (FWHM). Herein, the FWHM is a width of a wavelength corresponding to half of the maximum emission point in the emission spectrum. By applying the quantum dot having an emission spectrum of a relatively narrow FWHM and the light emitting layer 13 including the same to the quantum dot device 10, e.g., including the quantum dot and the light emitting layer including the same in the quantum dot device, high color purity (or color reproducibility) may be realized, e.g., provided.

The FWHM of the quantum dot (or light emitting layer 13) may be for example less than or equal to about 60 nm, less than or equal to about 55 nm, less than or equal to about 52 nm, less than or equal to about 50 nm, less than or equal to about 49 nm, less than or equal to about 48 nm, less than or equal to about 47 nm, less than or equal to about 46 nm, less than or equal to about 45 nm, less than or equal to about 44 nm, less than or equal to about 43 nm, less than or equal to about 42 nm, less than or equal to about 41 nm, less than or equal to about 40 nm, less than or equal to about 39 nm, less than or equal to about 38 nm, less than or equal to about 37 nm, less than or equal to about 36 nm, less than or equal to about 35 nm, less than or equal to about 34 nm, 15 less than or equal to about 33 nm, less than or equal to about 32 nm, less than or equal to about 31 nm, less than or equal to about 30 nm, less than or equal to about 29 nm, or less than or equal to about 28 nm, for example, about 2 nm to about 60 nm, about 2 nm to about 55 nm, about 2 nm to about 50 nm, about 2 nm to about 49 nm, about 2 nm to about 48 nm, about 2 nm to about 47 nm, about 2 nm to about 46 nm, about 2 nm to about 45 nm, about 2 nm to about 44 nm, about 2 nm to about 43 nm, about 2 nm to about 42 nm, about 2 nm to about 41 nm, about 2 nm to about 40 nm, about 2 nm to about 39 nm, about 2 nm to about 38 nm, about 2 nm to about 37 nm, about 2 nm to about 36 nm, about 2 nm to about 35 nm, about 2 nm to about 34 nm, about 2 nm to about 33 nm, about 2 nm to about 32 nm, about 2 nm to about 31 nm, about 2 nm to about 30 nm, about 2 nm to about 29 nm, or about 2 nm to about 28 nm.

For example, the quantum dot may include a Group II-VI semiconductor compound, a Group III-V semiconductor compound, a Group IV-VI semiconductor compound, a Group IV semiconductor element or compound, a Group I-III-VI semiconductor compound, a Group I-II-IV-VI semiconductor compound, a Group II-III-V semiconductor compound, or a combination thereof.

The Group II-VI semiconductor compound may be for example a binary element compound such as CdSe, CdTe, ZnS, ZnSe, ZnTe, ZnO, HgS, HgSe, HgTe, MgSe, MgS, or a combination thereof; a ternary element compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; or a quaternary element compound such as HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof, but is not limited thereto. The Group III-V semiconductor compound may be for example a binary element compound such as GaN, GaP, GaAs, GaSb, AlN, AlP, AlAs, AlSb, InN, InP, InAs, InSb, or a combination thereof; a ternary element compound such as GaNP, GaNAs, GaNSb, GaPAs, GaPSb, AlNP, AlNAs, AlNSb, AlPAs, AlPSb, InNP, InNAs, InNSb, InPAs, InPSb, or a combination thereof; or a quaternary element compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof, but is not limited thereto. The Group IV-VI semiconductor compound may be for example a binary element compound such as SnS, SnSe, SnTe, PbS, PbSe, PbTe, or a combination thereof; a ternary element compound such as SnSeS, SnSeTe, SnSTe, PbSeS, PbSeTe, PbSTe, SnPbS, SnPbSe, SnPbTe, or a combination thereof; or a quaternary element compound such as SnPbSSe, SnPbSeTe, SnPbSTe, or a combination thereof, but is not limited thereto. The Group IV semiconductor element or compound may be for example a single element semiconductor such as Si, Ge, or a combination thereof; or a binary element semiconductor compound such as SiC, SiGe, or a combination thereof, but is not limited thereto. The Group I-III-VI semiconductor compound may be for example $CuInSe_2$, $CuInS_2$, CuInGaSe, CuInGaS, or a combination thereof, but is not limited thereto. The Group I-II-IV-VI semiconductor compound may be for example CuZnSnSe, CuZnSnS, or a combination thereof, but is not limited thereto. The Group II-III-V semiconductor compound may include for example InZnP, but is not limited thereto.

The quantum dot may include a single element semiconductor, a binary semiconductor compound, a ternary semiconductor compound, or a quaternary semiconductor compound in a substantially uniform concentration, or may be included in a state having a partially different concentration distribution.

For example, the quantum dot may include a cadmium (Cd)-free quantum dot. Cadmium (Cd) may cause severe environment/health problems and a restricted element by Restriction of Hazardous Substances Directive (RoHS) in a plurality of countries, and thus the non-cadmium-based quantum dot may be effectively used. In an example, the light emitting layer 13 may not include cadmium. An example of the light emitting layer 13 may not include cadmium, lead, mercury, or a combination thereof.

As an example, the quantum dot may be a semiconductor compound including zinc (Zn), and at least one of tellurium (Te) and selenium (Se). For example, the quantum dot may be a Zn—Te semiconductor compound, a Zn—Se semiconductor compound, a Zn—Te—Se semiconductor compound, or a combination thereof. For example, a mole fraction of tellurium (Te) in the Zn—Te—Se semiconductor compound may be smaller than a mole fraction of selenium (Se). The semiconductor compound may have a maximum emission wavelength in a wavelength spectrum of less than or equal to about 480 nm, for example, about 430 nm to about 480 nm, and may be configured to emit blue light.

For example, the quantum dot may be a semiconductor compound including indium (In) and zinc (Zn), phosphorus (P), or a combination thereof. For example, the quantum dot may be an In—P semiconductor compound, an In—Zn—P semiconductor compound, or a combination thereof. For example, in the In—Zn—P semiconductor compound, a mole ratio of zinc (Zn) to indium (In) may be greater than or equal to about 25:1, for example from about 25:1 to about 100:1 or to about 250:1.

The quantum dot may have a core-shell structure wherein one quantum dot surrounds another quantum dot. For example, the core and the shell of the quantum dot may have an interface, and an element of the core, the shell, or a combination thereof in the interface may have a concentration gradient wherein the concentration of the element(s) of the shell decreases toward the core. For example, a material composition of the shell of the quantum dot may have a greater, e.g., higher, bandgap energy than a material composition of the core of the quantum dot, and the quantum dot may exhibit a quantum confinement effect.

The quantum dot may have one quantum dot core and a multilayered quantum dot shell surrounding the core. Herein, the multilayered shell has at least two shells wherein each shell may be a single composition, be an alloy, have a concentration gradient, or a combination thereof.

For example, a shell of a multilayered shell that is far, e.g., farthest, from the core may have a greater, e.g., higher, bandgap energy than a shell that is near, e.g., closest, to the core, and the quantum dot may exhibit a quantum confinement effect.

For example, the quantum dot having a core-shell structure may for example include a core including a first semiconductor compound including zinc (Zn) and tellurium (Te), selenium (Se), or a combination thereof and a shell disposed on at least a portion of the core and including a second semiconductor compound having a different composition from that of the core.

For example, the first semiconductor compound may be a Zn—Te—Se-based semiconductor compound including zinc (Zn), tellurium (Te), and selenium (Se), for example, a Zn—Se-based semiconductor compound including a small amount of tellurium (Te), for example, a semiconductor compound represented by $ZnTe_xSe_{1-x}$, where x is greater than about 0 and less than or equal to 0.05.

For example, in the Zn—Te—Se-based first semiconductor compound, a mole fraction of zinc (Zn) may be greater than that of selenium (Se), and a mole fraction of selenium (Se) may be greater than that of tellurium (Te). For example, in the first semiconductor compound, a mole ratio of tellurium (Te) to selenium (Se) may be less than or equal to about 0.05:1, less than or equal to about 0.049:1, less than or equal to about 0.048:1, less than or equal to about 0.047:1, less than or equal to about 0.045:1, less than or equal to about 0.044:1, less than or equal to about 0.043:1, less than or equal to about 0.042:1, less than or equal to about 0.041:1, less than or equal to about 0.04:1, less than or equal to about 0.039:1, less than or equal to about 0.035:1, less than or equal to about 0.03:1, less than or equal to about 0.029:1, less than or equal to about 0.025:1, less than or equal to about 0.024:1, less than or equal to about 0.023:1, less than or equal to about 0.022:1, less than or equal to about 0.021:1, less than or equal to about 0.02:1, less than or equal to about 0.019:1, less than or equal to about 0.018:1, less than or equal to about 0.017:1, less than or equal to about 0.016:1, less than or equal to about 0.015:1, less than or equal to about 0.014:1, less than or equal to about 0.013:1, less than or equal to about 0.012:1, less than or equal to about 0.011:1, or less than or equal to about 0.01:1. For example, in the first semiconductor compound, a mole ratio of tellurium (Te) to zinc (Zn) may be less than or equal to about 0.02:1, less than or equal to about 0.019:1, less than or equal to about 0.018:1, less than or equal to about 0.017:1, less than or equal to about 0.016:1, less than or equal to about 0.015:1, less than or equal to about 0.014:1, less than or equal to about 0.013:1, less than or equal to about 0.012:1, less than or equal to about 0.011:1, or less than or equal to about 0.010:1.

The second semiconductor compound may include, for example, a Group II-VI semiconductor compound, a Group III-V semiconductor compound, a Group IV-VI semiconductor compound, a Group IV semiconductor element or compound, a Group I-III-VI semiconductor compound, a Group I-II-IV-VI semiconductor compound, a Group II-III-V semiconductor compound, or a combination thereof. Examples of the Group II-VI semiconductor compound, Group III-V semiconductor compound, Group IV-VI semiconductor compound, Group IV semiconductor element or compound, Group I-III-VI semiconductor compound, Group I-II-IV-VI semiconductor compound, and Group II-III-V semiconductor compound are the same as described herein.

For example, the second semiconductor compound may include zinc (Zn), selenium (Se), sulfur (S), or a combination thereof. For example, the shell may include ZnSeS, ZnS, or a combination thereof. For example, the shell may include a, e.g., at least one, inner shell disposed close to the core and an outermost shell disposed at the outermost side of the quantum dot. The inner shell may include ZnSeS and the outermost shell may include ZnS. For example, the shell may have a concentration gradient of one component and for example a content of sulfur (S) may increase as being apart from the core.

For example, a quantum dot having a core-shell structure may include a core including a third semiconductor compound including indium (In) and zinc (Zn), phosphorus (P), or a combination thereof and a shell disposed on at least a portion of the core and including a fourth semiconductor compound having a composition different from the core.

In the In—Zn—P-based third semiconductor compound, a mole ratio of zinc (Zn) to indium (In) may be greater than or equal to about 25:1. For example, in the In—Zn—P-based third semiconductor compound, the mole ratio of zinc (Zn) to indium (In) may be greater than or equal to about 28:1, greater than or equal to about 29:1, or greater than or equal to about 30:1. For example, in the In—Zn—P-based third semiconductor compound, the mole ratio of zinc (Zn) to indium (In) may be less than or equal to about 55:1, for example less than or equal to about 50:1, less than or equal to about 45:1, less than or equal to about 40:1, less than or equal to about 35:1, less than or equal to about 34:1, less than or equal to about 33:1, or less than or equal to about 32:1.

The fourth semiconductor compound may include, for example, a Group II-VI semiconductor compound, a Group III-V semiconductor compound, a Group IV-VI semiconductor compound, a Group IV semiconductor element or compound, a Group I-III-VI semiconductor compound, a Group I-II-IV-VI semiconductor compound, a Group II-III-V semiconductor compound, or a combination thereof. Examples of the Group II-VI semiconductor compound, Group III-V semiconductor compound, Group IV-VI semiconductor compound, Group IV semiconductor element or compound, Group I-III-VI semiconductor compound, Group I-II-IV-VI semiconductor compound, and Group II-III-V semiconductor compound are the same as described herein.

For example, the fourth semiconductor compound may include zinc (Zn) and sulfur (S) and optionally selenium (Se). For example, the shell may include ZnSeS, ZnS, or a combination thereof. For example, the shell may include a, e.g., at least one, inner shell disposed close to the core and an outermost shell disposed at the outermost side of the quantum dot. The inner shell, the outermost shell, or a combination thereof may include a fourth semiconductor compound of ZnS, or ZnSeS.

The aforementioned quantum dots are commercially available or may be appropriately synthesized.

In the quantum dot device 10 of an example, the quantum dot(s) may include a first organic ligand on the surface thereof. The first organic ligand may have a hydrophobic moiety. The first organic ligand may be bound to the surface of the quantum dot. The first organic ligand may include RCOOH, $RNH_2$, $R_2NH$, $R_3N$, RSH, $R_3PO$, $R_3P$, ROH, RCOOR, $RPO(OH)_2$, RHPOOH, $R_2POOH$, or a combination thereof, wherein R is each independently a substituted or unsubstituted C3 (C5) to C40 aliphatic hydrocarbon group such as a substituted or unsubstituted C3 to C40 alkyl, alkenyl, etc., a substituted or unsubstituted C6 to C40 aromatic hydrocarbon group such as a substituted or unsubstituted C6 to C40 aryl group, etc., or a combination thereof.

Examples of the organic ligand may be a thiol compound such as methane thiol, ethane thiol, propane thiol, butane thiol, pentane thiol, hexane thiol, octane thiol, dodecane thiol, hexadecane thiol, octadecane thiol, benzyl thiol, and the like; an amine compound such as methane amine, ethane amine, propane amine, butane amine, pentyl amine, hexyl amine, octyl amine, nonylamine, decylamine, dodecyl amine, hexadecyl amine, octadecyl amine, dimethyl amine, diethyl amine, dipropyl amine, tributylamine, trioctylamine, and the like; a carboxylic acid compound such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, and the like; a phosphine compound such as methyl phosphine, ethyl phosphine, propyl phosphine, butyl phosphine, pentyl phosphine, octylphosphine, dioctyl phosphine, tributyl phosphine, trioctyl phosphine, and the like; a phosphine oxide compound such as methyl phosphine oxide, ethyl phosphine oxide, propyl phosphine oxide, butyl phosphine oxide, pentyl phosphine oxide, tributylphosphine oxide, octylphosphine oxide, dioctyl phosphine oxide, trioctylphosphine oxide, the like; a diphenyl phosphine compound, a triphenyl phosphine compound, or an oxide compound thereof; a C5 to C20 alkylphosphinic acid such as hexylphosphinic acid, octylphosphinic acid, dodecanephosphinic acid, tetradecanephosphinic acid, hexadecanephosphinic acid, octadecanephosphinic acid, and the like; a C5 to C20 alkyl phosphonic acid such as hexylphosphonic acid, octylphosphonic acid, dodecanephosphonic acid, tetradecanephosphonic acid, hexadecanephosphonic acid, octadecanephosphonic acid, and the like; and the like, but are not limited thereto. The quantum dots may include a single type hydrophobic organic ligand alone or two or more types of hydrophobic organic ligands may be used.

The quantum dots may further include a halogen in addition to an organic ligand (e.g., C5 or greater or C10 or greater fatty acid compound, e.g., oleic acid) on the surface (hereinafter, referred to as "halogen-treated quantum dots" or "halogenated quantum dots"). The content of halogen in halogen-treated quantum dots may be, for example, greater than or equal to about 1 microgram (μg), greater than or equal to about 1.5 μg, greater than or equal to about 3 μg, greater than or equal to about 4 μg, greater than or equal to about 5 μg, greater than or equal to about 6 μg, greater than or equal to about 7 μg, greater than or equal to about 8 μg, greater than or equal to about 9 μg, greater than or equal to about 10 μg, greater than or equal to about 11 μg, greater than or equal to about 12 μg, greater than or equal to about 12.5 μg, greater than or equal to about 13 μg, greater than or equal to about 14 μg, greater than or equal to about 15 μg, greater than or equal to about 16 μg, greater than or equal to about 17 μg, greater than or equal to about 18 μg, or greater than or equal to about 19 μg and less than about 30 μg, less than or equal to about 25 μg, less than or equal to about 20 μg, less than or equal to about 19.5 μg, less than or equal to about 19 μg, less than or equal to about 18 μg, less than or equal to about 17 μg, less than or equal to about 15 μg, less than or equal to about 12.5 μg, or less than or equal to about 12 μg per milligram (mg) of quantum dots, as determined by ion chromatography. The halogen may be chlorine.

An example of a method of preparing the halogen-treated quantum dots may include obtaining an organic dispersion including a plurality of quantum dots including a first organic ligand on the surface and a first organic solvent; obtaining a chloride solution including a polar organic solvent miscible with the first organic solvent and a metal halide; and adding the chloride solution to the organic dispersion so that the content of the metal halide is greater than or equal to about 0.1 wt % and less than or equal to about 10 wt %, based on the total weight of the quantum dots, and then stirring the resultant at a temperature of greater than or equal to about 45° C., for example, greater than or equal to about 50° C., greater than or equal to about 55° C., or greater than or equal to about 60° C. and less than or equal to about 150° C., less than or equal to about 140° C., less than or equal to about 100° C., less than or equal to about 90° C., less than or equal to about 80° C., or less than or equal to about 70° C. A volume ratio of the polar organic solvent to the first organic solvent may be less than or equal to about 0.1:1.

The metal halide (e.g., metal chloride) may include a zinc halide, an indium halide, a gallium halide, a magnesium halide, a lithium halide, or a combination thereof. The first organic solvent may include a substituted or unsubstituted C5 to C40 aliphatic hydrocarbon, a substituted or unsubstituted C6 to C40 aromatic hydrocarbon, a substituted or unsubstituted C3 to C40 alicyclic hydrocarbon, or a combination thereof. The polar organic solvent may include a C1 to C10 alcohol (e.g., methanol, ethanol, propanol, isopropanol, butanol, pentanol, hexanol, heptanol, etc.) or a combination thereof.

A thickness of the light emitting layer 13 may be, for example, about 5 nm to about 200 nm, about 10 nm to about 150 nm, about 20 nm to about 100 nm, or about 20 nm to about 80 nm.

The light emitting layer 13 may have a single layer or a multilayer structure in which two or more layers are stacked. In the multilayer structure, adjacent layers (e.g., the first light emitting layer and the second light emitting layer) may have same or different physical properties/compositions. At least one of the light emitting layers 13 of an example may further include a halogen (e.g., chlorine). The light emitting layer 13 of an example may exhibit a halogen content that changes in a thickness direction.

The light emitting layer 13 of an example may exhibit a carbon content that varies along a thickness direction. In an example of the light emitting layer 13, the carbon content may increase as it approaches a buffer layer 15. In an example of the light emitting layer 13, the carbon content may decrease as it approaches the buffer layer 15.

An example of the light emitting layer 13 may include a layer (hereinafter, referred to as a surface-treated first light emitting layer or a first layer) including quantum dots and having a surface treated with halogen (e.g., chlorine). A second layer including the halogen-treated quantum dots, a third layer including quantum dots having organic ligands, or a combination thereof may be disposed on the first layer. The second layer may be between the first layer and the third layer. The organic material (e.g., carbon) content (e.g., concentration) of the first layer may be lower than the organic material content of the second layer. The halogen (e.g., chlorine) content (e.g., concentration) of the first layer may be greater than the halogen content of the second layer. The organic material content of the first layer may be greater than the organic material content of the second layer. The halogen content of the first layer may be lower than the halogen content of the second layer. The organic material content of the light emitting layer 13 may be controlled by an appropriate means (post-treatment for the formed layer).

The light emitting layer 13 may have a relatively deep HOMO energy level, for example, a HOMO energy level of greater than or equal to about 5.4 eV, for example greater than or equal to about 5.6 eV, greater than or equal to about 5.7 eV, greater than or equal to about 5.8 eV, greater than or equal to about 5.9 eV, or greater than or equal to about 6.0 eV. The HOMO energy level of the light emitting layer 13 may be, for example, about 5.4 eV to about 7.0 eV, about 5.4 eV to about 6.8 eV, about 5.4 eV to about 6.7 eV, about 5.4 eV to about 6.5 eV, about 5.4 eV to about 6.3 eV, about 5.4 eV to about 6.2 eV, about 5.4 eV to about 6.1 eV, about 5.6 eV to about 7.0 eV, about 5.6 eV to about 6.8 eV, about 5.6 eV to about 6.7 eV, about 5.6 eV to about 6.5 eV about 5.6 eV to about 6.3 eV, about 5.6 eV to about 6.2 eV, about 5.6 eV to about 6.1 eV, about 5.7 eV to about 7.0 eV, about 5.7 eV to about 6.8 eV, about 5.7 eV to about 6.7 eV, about 5.7 eV to about 6.5 eV, about 5.7 eV to about 6.3 eV, about 5.7 eV to about 6.2 eV, about 5.7 eV to about 6.1 eV, about 5.8 eV to about 7.0 eV, about 5.8 eV to about 6.8 eV about 5.8 eV to about 6.7 eV, about 5.8 eV to about 6.5 eV, about 5.8 eV to about 6.3 eV, about 5.8 eV to about 6.2 eV, about 5.8 eV to about 6.1 eV, about 6.0 eV to about 7.0 eV, about 6.0 eV to about 6.8 eV, about 6.0 eV to about 6.7 eV, about 6.0 eV to about 6.5 eV, about 6.0 eV to about 6.3 eV, or about 6.0 eV to about 6.2 eV.

The light emitting layer 13 may have a relatively shallow LUMO energy level, for example, less than or equal to about 3.6 eV, less than or equal to about 3.5 eV, for example, less than or equal to about 3.4 eV, for example, less than or equal to about 3.3 eV, for example, less than or equal to about 3.2 eV, or for example, less than or equal to about 3.0 eV. The LUMO energy level of the light emitting layer 13 may be, for example, about 2.5 eV to about 3.6 eV, about 2.5 eV to about 3.5 eV, about 2.5 eV to about 3.4 eV, about 2.5 eV to about 3.3 eV, about 2.5 eV to about 3.2 eV, about 2.5 eV to about 3.1 eV, about 2.5 eV to about 3.0 eV, about 2.8 eV to about 3.6 eV, about 2.8 eV to about 3.5 eV, about 2.8 eV to about 3.4 eV, about 2.8 eV to about 3.3 eV, about 2.8 eV to about 3.2 eV, about 3.0 eV to about 3.6 eV, about 3.0 eV to about 3.5 eV, or about 3.0 eV to about 3.4 eV.

The light emitting layer 13 may have a bandgap energy of about 2.4 eV to about 2.9 eV. Within the disclosed range, the light emitting layer 13 may have a bandgap energy, for example, about 2.4 eV to about 2.8 eV, or about 2.4 eV to about 2.78 eV.

A first charge auxiliary layer 14 and a buffer layer 15 are disposed between the second electrode 12 and the light emitting layer 13.

The first charge auxiliary layer 14 may be a functional layer configured to improve electrical performance between the second electrode 12, and the light emitting layer 13. The first charge auxiliary layer 14 may increase the transport of the first charge carriers from the second electrode 12 to the light emitting layer 13, and may block the reverse injection of the second charge carriers from the light emitting layer 13 to the second electrode 12. One of the first charge carriers and the second charge carriers may be an electron and the other may be a hole. The first charge carriers may be major charge carriers (also known as majority charge carriers) between the second electrode 12 and the light emitting layer 13 and the second charge carriers may be minor charge carriers (also known as minority charge carriers) between the second electrode 12 and the light emitting layer 13.

For example, when the second electrode 12 may be a cathode, the first charge carriers may be electrons and the second charge carriers may be holes, and the first charge auxiliary layer 14 may be an electron auxiliary layer such as an electron transport layer, an electron injection layer, a hole blocking layer, or a combination thereof.

For example, when the second electrode 12 is an anode, the first charge carriers may be holes and the second charge carriers may be electrons, and the first charge auxiliary layer 14 may be a hole auxiliary layer such as a hole transport layer, a hole injection layer, an electron blocking layer, or a combination thereof.

The first charge auxiliary layer 14 may have one or two or more layers, and may be for example in contact with the second electrode 12.

The first charge auxiliary layer 14 may include a charge transport material, for example, an electron transport material. For example, the first charge auxiliary layer 14 may include inorganic nanoparticles. The inorganic nanoparticles may be, for example, oxide nanoparticles, such as metal oxide nanoparticles. For example, the inorganic nanoparticles may be metal oxide nanoparticles including two or more types of metals. For example, the inorganic nanoparticles may be inorganic semiconductors. For example, the inorganic nanoparticles may be n-type inorganic nanoparticles.

The inorganic nanoparticles may be two-dimensional or three-dimensional nanoparticles having an average particle diameter of, for example, less than or equal to about 10 nm, less than or equal to about 8 nm, less than or equal to about 7 nm, less than or equal to about 5 nm, less than or equal to about 4 nm, or less than or equal to about 3.5 nm, for example, about 1 nm to about 10 nm, about 1 nm to about 9 nm, about 1 nm to about 8 nm, about 1 nm to about 7 nm, about 1 nm to about 5 nm, about 1 nm to about 4 nm, or about 1 nm to about 3.5 nm.

The LUMO energy level of the inorganic nanoparticles (or the first charge auxiliary layer 14) may be deeper or shallower than the LUMO energy level of the light emitting layer 13, for example, the LUMO energy level of the inorganic nanoparticles (or the first charge auxiliary layer 14) may be deeper than the LUMO energy level of the light emitting layer 13. The difference between the LUMO energy level of the inorganic nanoparticles (or the first charge auxiliary layer 14) and the LUMO energy level of the light emitting layer 13 may be, for example, less than or equal to about 2.5 eV, less than or equal to about 2.3 eV, less than or equal to about 2.0 eV, less than or equal to about 1.8 eV, less than or equal to about 1.0 eV, less than or equal to about 0.5 eV, less than or equal to about 0.3 eV, or less than or equal to about 0.2 eV. The LUMO energy level of the inorganic nanoparticles (or the first charge auxiliary layer 14) may be, for example, about 2.5 eV to about 4.8 eV, about 2.6 eV to about 4.6 eV, or about 2.7 eV to about 4.5 eV.

The HOMO energy level of the inorganic nanoparticles (or the first charge auxiliary layer 14) may be deeper than, for example, the HOMO energy level of the light emitting layer 13. For example, the HOMO energy level of the inorganic nanoparticles (or first charge auxiliary layer 14) may be deeper than the HOMO energy level of the light emitting layer 13 by greater than or equal to about 0.2 eV, greater than or equal to about 0.5 eV, greater than or equal to about 0.8 eV, greater than or equal to about 1.0 eV, greater than or equal to about 1.2 eV, or greater than or equal to about 1.5 eV, for example, about 0.2 eV to about 3.0 eV, about 0.5 eV to about 3.0 eV, about 0.8 eV to about 3.0 eV, about 1.0 eV to about 3.0 eV, about 1.2 eV to about 3.0 eV, or about 1.5 eV to about 3.0 eV.

For example, the inorganic nanoparticles (or the first charge auxiliary layer 14) may have a relatively deep HOMO energy level, and the HOMO energy level of the inorganic nanoparticles (or the first charge auxiliary layer 14) may be, for example, about 5.6 eV to about 8.5 eV, about 5.8 eV to about 8.2 eV, about 6.0 eV to about 8.0 eV, about 6.2 eV to about 8.0 eV, about 6.5 eV to about 8.0 eV, about 6.8 eV to about 8.0 eV, about 7.0 eV to about 8.0 eV, about 7.2 eV to about 7.9 eV, or about 7.3 eV to about 7.8 eV. The inorganic nanoparticles (or the first charge auxiliary layer 14) may be configured to effectively block the reverse injection of the second charge carriers (minor charge carriers, for example holes) from the light emitting layer 13 by having a relatively deep HOMO energy level as described herein, and thus may improve stability of the quantum dot device 10.

The inorganic nanoparticles may include a material satisfying the aforementioned energy level, for example, a metal oxide nanoparticle including zinc (Zn), magnesium (Mg), cobalt (Co), nickel (Ni), gallium (Ga), aluminum (Al), calcium (Ca), zirconium (Zr), tungsten (W), lithium (Li), titanium (Ti), tantalum (Ta), tin (Sn), hafnium (Hf), barium (Ba), or a combination thereof.

For example, the inorganic nanoparticles may include metal oxide nanoparticles including zinc (Zn), for example, metal oxide nanoparticles expressed as $Zn_{1-x}Q_xO$ ($0 \leq x < 0.5$). Q may include one or more metals other than Zn, such as magnesium (Mg), cobalt (Co), nickel (Ni), gallium (Ga), aluminum (Al), calcium (Ca), zirconium (Zr), tungsten (W), lithium (Li), titanium (Ti), tantalum (Ta), tin (Sn), hafnium (Hf), silicon (Si), barium (Ba), or a combination thereof.

For example, Q may include magnesium (Mg).

For example, x may satisfy the range of $0.01 \leq x \leq 0.4$, $0.01 \leq x \leq 0.3$, or $0.01 \leq x \leq 0.2$.

The first charge auxiliary layer 14 may further include an alkali metal, an alkali metal compound, or a combination thereof in addition to the aforementioned inorganic nanoparticles. The alkali metal, alkali metal compound, or combination thereof may be included in the form of a mixture with the aforementioned inorganic nanoparticles, and may be included in a limited amount in the first charge auxiliary layer 14 to effectively improve the electrical characteristics of the first charge auxiliary layer 14.

The alkali metal, alkali metal compound, or combination thereof may be included in the form of, for example, an alkali metal cation, an alkali metal cation derived from an alkali metal compound, or a combination thereof. The alkali metal compound may be a compound including an alkali metal, for example, alkali carbonate, alkali phosphate, alkali vanadate, alkali azide, alkali nitride, or a combination thereof.

The alkali metal or alkali metal included in the alkali metal compound may be, for example, lithium (Li), sodium (Na), potassium (K), cesium (Cs), rubidium (Rb), francium (Fr) or a combination thereof. These lithium (Li), sodium (Na), potassium (K), cesium (Cs), rubidium (Rb), or francium (Fr) may be included in a form of a lithium cation, a sodium cation, a potassium cation, a cesium cation, a rubidium cation, or a francium cation, respectively.

The alkali metal compound (e.g., alkali metal salt) may further include an anion such as carbonate ($CO_3^{2-}$), phosphate ($PO_4^{3-}$), vanadate ($VO_4^{3-}$), azide ($N_3^-$), or nitride ($N^{3-}$), together with the alkali metal cation.

For example, the alkali metal may be lithium (Li), sodium (Na), potassium (K), cesium (Cs), rubidium (Rb), francium (Fr), or a combination thereof, and the alkali metal compound may be cesium carbonate ($Cs_2CO_3$), cesium phosphate ($Cs_3PO_4$), cesium vanadate ($Cs_3VO_4$), cesium azide ($CsN_3$), lithium carbonate ($LiCO_3$), lithium nitride ($Li_3N$), sodium carbonate ($Na_2CO_3$), potassium carbonate ($K_2CO_3$), rubidium carbonate ($Rb_2CO_3$), or a combination thereof, but is not limited thereto.

In the first charge auxiliary layer 14, the total alkali metal derived from the alkali metal, alkali metal compound, or combination thereof may be included in a less amount than inorganic nanoparticles. For example, the total alkali metal derived from the alkali metal, alkali metal compound, or combination thereof may be included in an amount of about 0.1 volume percent (vol %) to about 30 vol %, about 0.1 vol % to about 25 vol %, about 0.1 vol % to about 20 vol %, about 0.5 vol % to about 18 vol %, about 1 vol % to about 15 vol %, or about 3 vol % to about 15 vol %, based on the first charge auxiliary layer 14. For example, the total alkali metal derived from the alkali metal, alkali metal compound, or combination thereof may be included in an amount of less than about 0.5 atomic percent (at %), based on the total number of atoms included in the first charge auxiliary layer 14.

A thickness of the first charge auxiliary layer 14 may be less than or equal to about 80 nm, for example, about 2 nm to about 80 nm, about 5 nm to about 80 nm, about 10 nm to about 60 nm, about 15 nm to about 50 nm, or about 10 nm to about 20 nm.

The buffer layer 15 may be between the light emitting layer 13 and the first charge auxiliary layer 14 to prevent deterioration of electrical performance that may occur at the interface between the light emitting layer 13 and the first charge auxiliary layer 14.

For example, the buffer layer 15 may effectively extract excess charge carriers that have not been recombined in the light emitting layer 13 and may effectively prevent the generation of non-emission excitons that are abnormally recombined at the interface (boundary) of the light emitting layer 13 rather than inside the light emitting layer 13 and cannot participate in light emission, and deterioration of the interface of the light emitting layer 13 may be prevented.

As described herein, the first charge auxiliary layer 14 may enhance transport of the first charge carriers (major charge carriers, for example electrons) from the second electrode 12 to the light emitting layer 13 while blocking reverse injection of the second charge carriers (minor charge carrier, for example holes) from the light emitting layer 13 to the second electrode 12. In order to block the reverse injection of these second charge carriers (minor charge carriers, for example, holes), as described herein, the HOMO energy level of the first charge auxiliary layer 14 may be deeper than the HOMO energy level of the light emitting layer 13.

If there is no buffer layer 15, the light emitting layer 13 and the first charge auxiliary layer 14 may contact each other, and the excess second charge carriers (minor charge carriers, for example holes) that are not recombined in the light emitting layer 13 may be blocked by the first charge auxiliary layer 14 (e.g., a deep HOMO energy level of the first charge auxiliary layer 14) to be accumulated at the interface between the light emitting layer 13 and the first charge auxiliary layer 14. In addition, the excess second charge carriers (minor charge carriers, for example holes) accumulated at the interface may be abnormally combined with the first charge carriers (major charge carriers, for example electrons) moving from the second electrode 12 to the light emitting layer 13 at the interface to generate non-emission excitons. Such excess second charge carriers (minor charge carriers, for example, holes) and non-emission excitons may be accumulated at the interface between the light emitting layer 13 and the first charge auxiliary layer 14 to deteriorate the interface of the light emitting layer 13 and may become a leakage path of the quantum dot device 10, eventually deteriorating life-span characteristics and electrical characteristics of the quantum dot device 10.

The buffer layer 15 may be between the light emitting layer 13 and the first charge auxiliary layer 14 so that the light emitting layer 13 and the first charge auxiliary layer 14 do not directly contact with each other, and may increase the extraction of excess second charge carriers (minor charge carriers, for example, holes) from the light emitting layer 13 to prevent accumulation of excess second charge carriers (minor charge carriers, for example, holes) at the interface of the light emitting layer 13 and to prevent the generation of non-emission excitons at the interface.

For example, the buffer layer 15 may be a minor charge carrier trapping layer capable of trapping an excess of second charge carriers (minor charge carriers, for example, holes). For example, the number of trap sites in the buffer layer 15 may be controlled by the content of a second charge auxiliary material (e.g., a hole extraction material), which will be described herein.

As described herein, the first charge auxiliary layer 14 may be configured to block the reverse injection of the second charge carriers (minor charge carriers, for example, holes), the excess second charge carriers (minor charge carriers, for example, holes) extracted into the buffer layer 15 may be blocked by the first charge auxiliary layer 14 and confined in the buffer layer 15, and the buffer layer 15 may become an accumulated zone of excess second charge carriers (minor charge carriers, for example, holes) instead of the interface of the light emitting layer 13, effectively preventing deterioration of the interface of the light emitting layer 13.

For example, the buffer layer 15 may be in contact with the light emitting layer 13.

For example, the buffer layer 15 may be in contact with the first charge auxiliary layer 14.

For example, one surface of the buffer layer 15 may be in contact with the light emitting layer 13, and the other surface of the buffer layer 15 may be in contact with the first charge auxiliary layer 14.

For example, the buffer layer 15 may include a first charge auxiliary material configured to enhance transport of the first charge carriers (major charge carriers, for example electrons) from the second electrode 12 to the light emitting layer 13 and a second charge auxiliary material configured to enhance extraction of the second charge carriers (minor charge carriers, for example holes). The first charge auxiliary material and the second charge auxiliary material may be blended in the buffer layer 15. The first charge auxiliary material may provide a transport path for the first charge carriers (major charge carriers, for example electrons) in the buffer layer 15 and the second charge auxiliary material may provide an extraction path for the second charge carriers (minor charge carriers, for example holes) within the buffer layer 15.

For example, when the first charge carriers are electrons and the second charge carriers are holes, the HOMO energy level of the second charge auxiliary material may be shallower than the HOMO energy level of the first charge auxiliary material. For example, the HOMO energy level of the second charge auxiliary material may be shallower than the HOMO energy level of the first charge auxiliary material by greater than or equal to about 0.1 eV, greater than or equal to about 0.2 eV, greater than or equal to about 0.4 eV, greater than or equal to about 0.5 eV, greater than or equal to about 0.7 eV, or greater than or equal to about 1.0 eV, about 0.1 eV to about 5.0 eV, about 0.1 eV to about 4.5 eV, about 0.1 eV to about 4.0 eV, about 0.1 eV to about 3.5 eV, about 0.1 eV to about 3.0 eV, about 0.2 eV to about 5.0 eV, about 0.2 eV to about 4.5 eV, about 0.2 eV to about 4.0 eV, about 0.2 eV to about 3.5 eV, about 0.2 eV to about 3.0 eV, about 0.4 eV to about 5.0 eV, about 0.4 eV to about 4.5 eV, about 0.4 eV to about 4.0 eV, about 0.4 eV to about 3.5 eV, about 0.4 eV to about 3.0 eV, about 0.5 eV to about 5.0 eV, about 0.5 eV to about 4.5 eV, about 0.5 eV to about 4.0 eV, about 0.5 eV to about 3.5 eV, about 0.5 eV to about 3.0 eV, about 0.7 eV to about 5.0 eV, about 0.7 eV to about 4.5 eV, about 0.7 eV to about 4.0 eV, about 0.7 eV to about 3.5 eV, about 0.7 eV to about 3.0 eV, about 1.0 eV to about 5.0 eV, about 1.0 eV to about 4.5 eV, about 1.0 eV to about 4.0 eV, about 1.0 eV to about 3.5 eV, or about 1.0 eV to about 3.0 eV.

For example, when the first charge carriers are holes and the second charge carriers are electrons, the LUMO energy level of the second charge auxiliary material may be deeper than the LUMO energy level of the first charge auxiliary material. For example, the LUMO energy level of the second charge auxiliary material may be deeper than the LUMO energy level of the first charge auxiliary material by greater than or equal to about 0.1 eV, greater than or equal to about 0.2 eV, greater than or equal to about 0.4 eV, greater than or equal to about 0.5 eV, greater than or equal to about 0.7 eV, or greater than or equal to about 1.0 eV, for example, about 0.1 eV to about 3.0 eV, about 0.2 eV to about 3.0 eV, about 0.4 eV to about 3.0 eV, about 0.5 eV to about 3.0 eV, about 0.7 eV to about 3.0 eV or about 1.0 eV to about 3.0 eV.

For example, when the first charge carriers are electrons and the second charge carriers are holes, the first charge auxiliary material may be an electron transport material and the second charge auxiliary material may be a hole extraction material. The first charge auxiliary material may be the same as or different from the charge transport material included in the first charge auxiliary layer 14.

For example, the conductivity (e.g., hole conductivity) of the second charge carriers (minor charge carriers) of the second charge auxiliary material (e.g., hole extraction material) may be greater than the conductivity (e.g., hole conductivity) of the second charge carriers (minor charge carriers) of the first charge auxiliary material (e.g., electron transport material). For example, the conductivity (e.g., hole conductivity) of the second charge carriers (minor charge carriers) of the second charge auxiliary material (e.g., hole extraction material) may be about 1.01 times to about 104 times, about 1.2 times to about 104 times, about 1.5 times to about 104 times, about 2 times to about 104 times, about 5 times to about 104 times, or about 10 times to about 104 times the conductivity (e.g., hole conductivity) of the second charge carriers (minor charge carriers) of the first charge auxiliary material (e.g., electron transport material).

For example, the charge mobility (e.g., electron mobility) of the first charge auxiliary material (e.g., electron transport material) may be greater than or equal to about 100 square centimeters per volt-second ($cm^2/Vs$), or about 100 $cm^2/Vs$ to about 1,000 $cm^2/Vs$. For example, the charge mobility (e.g., hole mobility) of the second charge auxiliary material (e.g., hole extraction material) may be greater than or equal to about $10^{-5}$ $cm^2/Vs$, or about $10^{-5}$ $cm^2/Vs$ to about $10^{-4}$ $cm^2/Vs$.

The first charge auxiliary material (e.g., an electron transport material) may include, for example, an n-type non-polymer material (e.g., an n-type non-polymer organic material), an n-type polymer, an n-type inorganic material, an n-type organic-inorganic material, or a combination thereof. For example, the first charge auxiliary material may include inorganic nanoparticles, for example, n-type inorganic nanoparticles. For example, the first charge auxiliary material may be the same as or different from the charge transport material included in the first charge auxiliary layer 14, and may include, for example, the same or different n-type inorganic nanoparticles. For example, the first charge auxiliary material may include metal oxide nanoparticles including zinc (Zn), for example, metal oxide nanoparticles represented by $Zn_{1-x}Q_xO$ ($0 \le x < 0.5$, for example, $0.01 \le x \le 0.4$, $0.01 \le x \le 0.3$, or $0.01 \le x \le 0.2$). Q is one or more metals other than Zn, for example, magnesium (Mg), cobalt (Co), nickel (Ni), gallium (Ga), aluminum (Al), calcium (Ca), zirconium (Zr), tungsten (W), lithium (Li), titanium (Ti), tantalum (Ta), tin (Sn), hafnium (Hf), silicon (Si), barium (Ba), or a combination thereof. For example, the first charge auxiliary material may be the same as or different from the electron transport material included in the first charge auxiliary layer 14.

The second charge auxiliary material (e.g., hole extraction material) may include, for example, a p-type non-polymer material (e.g., a p-type non-polymer organic material), a p-type polymer, a p-type inorganic material, a p-type organic-inorganic material, or a combination thereof. For example, the second charge auxiliary material may include N,N,N',N'-tetrakis(4-methoxyphenyl)-benzidine (TPD), N,N'-di(1-naphthyl)-N,N'-diphenyl-(1,1'-biphenyl)-4,4'-diamine (NPD), 4,4',4"-tris[phenyl(m-tolyl)amino]triphenylamine) (m-MTDATA), 4,4',4"-tris(N-carbazolyl)-triphenylamine (TCTA), 1,1-bis[(di-4-tolylamino)phenyl] cyclohexane (TAPC), N2,N7-di(naphthalen-1-yl)-9,9-dioctyl-N2,N7-diphenyl-9H-fluorene-2,7-diamine (NPB), 2,7-bis(carbazol-9-yl)-9,9-spirobifluorene (Spiro-2CBP), 2,2',7,7'-tetra(N,N-di-p-tolyl)amino-9,9-spirobifluorene (Spiro-TTB), 2,2',7,7'-tetrakis(N,N-diphenylamino)-9,9-spirobifluorene (Spiro-TAD), 4,4'-bis(N-carbazolyl)-1,1'-biphenyl (CBP), 4,4',4"-tris[2-naphthyl(phenyl)amino]triphenylamine (2-TNATA), 1,3,5-tris(4-diphenylaminophenyl) benzene (TDAPB), poly(9,9-dioctyl-fluorene-co-N-(4-butylphenyl)-diphenylamine) (TFB), polyarylamine, poly (N-vinylcarbazole), poly(3,4-ethylenedioxythiophene) (PEDOT), poly(3,4-ethylenedioxythiophene) polystyrene sulfonate (PEDOT:PSS), polyaniline, polypyrrole, Spiro-PMATD, triphenylbismuth dichloride (TPBC), H-111, a compound of the formula

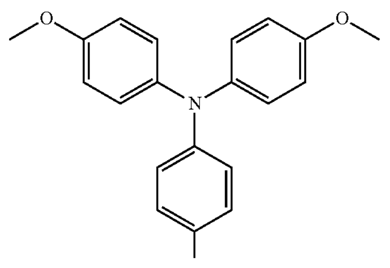

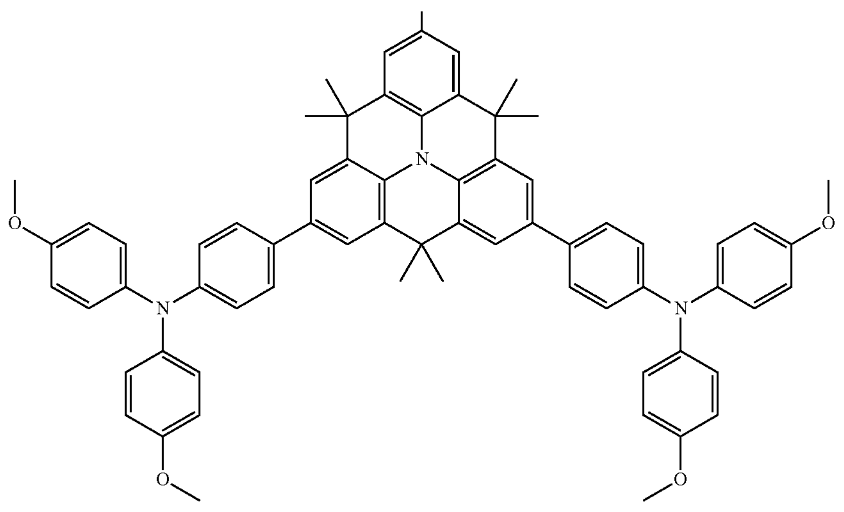

OMeTPA-FA (OMe TPA-FA, 2TPA-2-DP (where TPA is 4,4'-((1E, 1'E, 3E,3'E)-[1,1'-biphenyl]-4,4'-diylbis(buta-1,3-diene-4,1-diyl)); DP=bis(N,N-di-p-tolylaniline); n=2), pyridine diimide (PDI), poly(triaryl amine) (PTAA), poly(3-hexylthiophene-2,5-diyl) (P3HT), poly[3-(5-carboxypentyl) thiophene-2,5-diyl] (P3CPenT), poly[2,6-(4,4-bis-(2-ethylhexyl)-4H-cyclopenta[2,1-b;3,4-b']dithiophene)-alt-4, 7(2,1,3-benzothiadiazole)] (PCPDT-t), poly(2,3-dihydrothieno[3,4-b][1,4]dioxane-5,7-diyl) (PEDOT-S), polyferric sulfate (PFS), poly[2,6-(4,4-bis-potassium butanylsulfonate-4H-cyclopenta-[2,1-b;3,4-b']-dithiophene)-alt-4,7-(2,1,3-benzothiadiazole)] (CPE-K), a compound of the formula

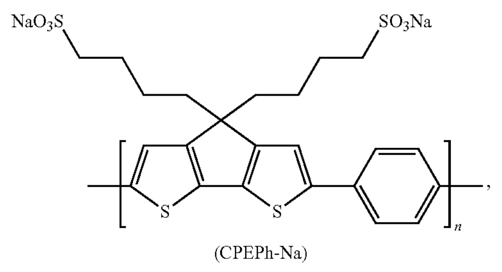

(CPEPh-Na)

(CPEPh-Na), phenylsodium (PhNa-IT), sulfonated poly(diphenylamine) (SPDPA), phlorofucofuroeckol (p-PFF-O), poly[2,6-(4,4-bis(2-ethylhexyl)-4H-cyclopenta[2,1-b;3,4-b"]dithiophene)-alt-4,7-(2,1,3-benzothiadiazole)] (CPE-PCPDT-K), poly[(9,9-bis(4-sulfonatobutyl sodium) fluorene-alt-phenylene)-ran-(4,7-di-2-thienyl-2,1,3-benzothiadiazole-alt-phenylene)] (PSFP-DTBTP), CuI, $Cu_2O$, CuO, CuS, $NiO_x$, $CuGaO_2$, CuPc, CuSCN, $MoO_x$, $MoS_2$, $VO_x$, $CoO_x$, graphene oxide, or a combination thereof, but is not limited thereto.

For example, the second charge auxiliary material (e.g., hole extraction material) may be inorganic nanoparticles, for example, inorganic nanoparticles including the aforementioned p-type inorganic material. For example, at least one of the first charge auxiliary material (e.g., the electron transport material) included in the buffer layer 15, the second charge auxiliary material (e.g., the hole extraction material) included in the buffer layer 15, and the electron transport material included in the first charge auxiliary layer 14 may be inorganic nanoparticles.

The content of the second charge auxiliary material may be determined in consideration of the number of trap sites in the buffer layer 15, and as the content of the second charge auxiliary material increases, the number of trap sites in the buffer layer 15 may increase. For example, in the buffer layer 15, the amount of the second charge auxiliary material may be less than that of the first charge auxiliary material. For example, in the buffer layer 15, the second charge auxiliary material may be included in an amount of less than or equal to about 40 wt %, less than or equal to about 30 wt %, less than or equal to about 20 wt %, less than or equal to about 15 wt %, less than or equal to about 12 wt %, less than or equal to about 10 wt %, less than or equal to about 8 wt %, or less than or equal to about 6 wt %, for example about 0.1 wt % to about 40 wt %, about 0.1 wt % to about 30 wt %, about 0.1 wt % to about 20 wt %, about 0.1 wt % to about 15 wt %, about 0.1 wt % to about 12 wt %, about 0.1 wt % to about 10 wt %, about 0.1 wt % to about 8 wt %, about 0.1 wt % to about 6 wt %, about 1 wt % to about 40 wt %, about 1 wt % to about 30 wt %, about 1 wt % to about 20 wt %, about 1 wt % to about 15 wt %, about 1 wt % to about 12 wt %, about 1 wt % to about 10 wt %, about 1 wt % to about 8 wt %, or about 1 wt % to about 6 wt %, based on the total amount of the first charge auxiliary material and the second charge auxiliary material.

The buffer layer 15 may have a conductivity (e.g., hole conductivity) of the second charge carriers (minor charge carriers) that is greater than the conductivity (e.g., hole conductivity) of the second charge carriers (minor charge carriers) of the first charge auxiliary layer 14 by including the aforementioned second charge auxiliary material. For example, the conductivity (e.g., hole conductivity) of the second charge carriers (minor charge carriers, e.g., hole) of the buffer layer 15 may be about 1.01 times to about 104 times, about 1.2 times to about 104 times, about 1.5 times to about 104 times, about 2 times to about 104 times, about 5 times to about 104 times, or about 10 times to about 104 times the conductivity (e.g., hole conductivity) of the second charge carriers (minor charge carriers, e.g., hole) of the first charge auxiliary layer 14. The conductivity (e.g., hole conductivity) of the second charge carriers (minor charge carriers) may be measured and compared with conductive atomic force microscopy (C-AFM).

The buffer layer 15 may have greater conductivity (e.g., hole conductivity) of the second charge carriers (minor charge carriers, e.g., hole) than the first charge auxiliary layer 14 and the light emitting layer 13 by including the aforementioned second charge auxiliary material. For example, the conductivity (e.g., hole conductivity) of the second charge carriers (minor charge carriers) of the buffer layer 15 may be about 1.01 times to about 104 times, about 1.2 times to about 104 times, about 1.5 times to about 104 times, about 2 times to about 104 times, about 5 times to about 104 times, or about 10 times to about 104 times the conductivity (e.g., hole conductivity) of the second charge carriers (minor charge carriers, e.g., hole) of the first charge auxiliary layer 14 and the conductivity (e.g., hole conductivity) of the second charge carriers (minor charge carriers, e.g., hole) of the light emitting layer 13. Accordingly, when the conductivity is measured along the cross section of the quantum dot device 10 using a conductive atomic force microscope (C-AFM), a peak may be shown in the buffer layer 15.

The thickness of the buffer layer 15 may be the same as or thinner than the thickness of the first charge auxiliary layer 14. The thickness of the buffer layer 15 may be, for example, less than or equal to about 20 nm, for example, less than or equal to about 15 nm, less than or equal to about 12 nm, less than or equal to about 10 nm, less than or equal to about 8 nm, less than or equal to about 7 nm, or less than or equal to about 5 nm, for example, about 1 nm to about 20 nm, about 1 nm to about 15 nm, about 1 nm to about 12 nm, about 1 nm to about 10 nm, about 1 nm to about 8 nm, about 1 nm to about 7 nm, or about 1 nm to about 5 nm.

The second charge auxiliary layer 16 is between the first electrode 11 and the light emitting layer 13. The second charge auxiliary layer 16 may be a functional layer for improving electrical performance between the first electrode 11 and the light emitting layer 13, and may increase transport of the second charge carriers from the first electrode 11 to the light emitting layer 13. The second charge carriers may be major charge carriers between the first electrode 11 and the light emitting layer 13. For example, when the first electrode 11 is an anode, the second charge carriers may be holes, and the second charge auxiliary layer 16 may be a hole auxiliary layer such as a hole transport layer, a hole injection layer, an electron blocking layer, or a combination thereof. For example, when the first electrode 11 is a cathode, the second charge carriers is electrons, and the second charge auxiliary layer 16 may be an electron auxiliary layer such as an electron transport layer, an electron injection layer, a hole blocking layer, or a combination thereof. The second charge auxiliary layer 16 may include one layer or two or more layers.

For example, the first electrode 11 may be an anode and the second electrode 12 may be a cathode. The first charge auxiliary layer 14 may be an electron auxiliary layer such as an electron transport layer, an electron injection layer, a hole blocking layer, or a combination thereof, and the second charge auxiliary layer 16 may be a hole auxiliary layer such as a hole transport layer, a hole injection layer, an electron blocking layer, or a combination thereof.

The HOMO energy level of the second charge auxiliary layer 16 may have a relatively deep HOMO energy level to match the HOMO energy level of the light emitting layer 13. Accordingly, the mobility of the second charge carriers (e.g., holes) transferred from the second charge auxiliary layer 16 to the light emitting layer 13 may be increased.

The HOMO energy level of the second charge auxiliary layer 16 may be equal to or smaller than the HOMO energy level of the light emitting layer 13 within a range of less than or equal to about 1.0 eV. For example, a difference between the HOMO energy level of the light emitting layer 13 and the second charge auxiliary layer 16 may be about 0 eV to about 1.0 eV, about 0.01 eV to about 0.8 eV, about 0.01 eV to about 0.7 eV, about 0.01 eV to about 0.5 eV, about 0.01 eV to about 0.4 eV, about 0.01 eV to about 0.3 eV, about 0.01 eV to about 0.2 eV, or about 0.01 eV to about 0.1 eV.

The HOMO energy level of the second charge auxiliary layer 16 may be, for example, greater than or equal to about 5.0 eV, greater than or equal to about 5.2 eV, greater than or equal to about 5.4 eV, greater than or equal to about 5.6 eV, or greater than or equal to about 5.8 eV.

For example, the HOMO energy level of the second charge auxiliary layer 16 may be about 5.0 eV to about 7.0 eV, about 5.2 eV to about 6.8 eV, about 5.4 eV to about 6.8 eV, about 5.4 eV to about 6.7 eV, about 5.4 eV to about 6.5 eV, about 5.4 eV to about 6.3 eV, about 5.4 eV to about 6.2 eV, about 5.4 eV to about 6.1 eV, about 5.6 eV to about 7.0 eV, about 5.6 eV to about 6.8 eV, about 5.6 eV to about 6.7 eV, about 5.6 eV to about 6.5 eV, about 5.6 eV to about 6.3 eV, about 5.6 eV to about 6.2 eV, about 5.6 eV to about 6.1 eV, about 5.8 eV to about 7.0 eV, about 5.8 eV to about 6.8 eV, about 5.8 eV to about 6.7 eV, about 5.8 eV to about 6.5 eV, about 5.8 eV to about 6.3 eV, about 5.8 eV to about 6.2 eV, or about 5.8 eV to about 6.1 eV.

The second charge auxiliary layer 16 may include one or more hole transport materials, and the hole transport materials may include, for example, N,N,N',N'-tetrakis(4-methoxyphenyl)-benzidine (TPD), N,N'-di(1-naphthyl)-N,N'-diphenyl-(1,1'-biphenyl)-4,4'-diamine (NPD), 4,4',4"-tris[phenyl(m-tolyl)amino]triphenylamine) (m-MTDATA), 4,4',4"-tris(N-carbazolyl)-triphenylamine (TCTA), 1,1-bis[(di-4-tolylamino)phenyl]cyclohexane (TAPC), N2,N7-di(naphthalen-1-yl)-9,9-dioctyl-N2,N7-diphenyl-9H-fluorene-2,7-diamine (NPB), 2,7-bis(carbazol-9-yl)-9,9-spirobifluorene (Spiro-2CBP), 2,2',7,7'-tetra(N,N-di-p-tolyl)amino-9,9-spirobifluorene (Spiro-TTB), 2,2',7,7'-tetrakis(N,N-diphenylamino)-9,9-spirobifluorene (Spiro-TAD), 4,4'-bis(N-carbazolyl)-1,1'-biphenyl (CBP), 4,4',4"-tris[2-naphthyl(phenyl)amino]triphenylamine (2-TNATA), 1,3,5-tris(4-diphenylaminophenyl)benzene (TDAPB), poly(9,9-dioctyl-fluorene-co-N-(4-butylphenyl)-diphenylamine) (TFB), polyarylamine, poly(N-vinylcarbazole), poly(3,4-ethylenedioxythiophene (PEDOT), poly(3,4-ethylenedioxythiophene)polystyrene sulfonate (PEDOT:PSS), polyaniline, polypyrrole, Spiro-PMATD, triphenylbismuth dichloride (TPBC), H-111, OMe TPA-FA, 2TPA-2-DP, pyridine diimide (PDI), poly(triaryl amine) (PTAA), poly(3-hexylthiophene-2,5-diyl) (P3HT), poly[3-(5-carboxypentyl)thiophene-2,5-diyl](P3CPenT), poly[2,6-(4,4-bis-(2-ethylhexyl)-4H-cyclopenta[2,1-b;3,4-b']dithiophene)-alt-4,7(2,1,3-benzothiadiazole)] (PCPDT-t), poly(2,3-dihydrothieno[3,4-b][1,4]dioxane-5,7-diyl) (PEDOT-S), polyferric sulfate (PFS), CPE-K, PDTffPhSO3K RC2100, CPEPh-Na, phenyl sodium (PhNa-IT), sulfonated poly(diphenylamine) (SPDPA), phlorofucofuroeckol (p-PFF-O), poly[2,6-(4,4-bis(2-ethylhexyl)-4H-cyclopenta[2,1-b;3,4-b"]dithiophene)-alt-4,7-(2,1,3-benzothiadiazole)] (CPE-PCPDT-K), PSFP-DTBTP, CuI, $Cu_2O$, CuO, CuS, $NiO_x$, $CuGaO_2$, CuPc, CuSCN, $MoO_x$, $MoS_2$, $VO_x$, $CoO_x$, graphene oxide, or a combination thereof, but is not limited thereto. For example, the hole transport material included in the second charge auxiliary layer 16 may be the same as or different from the hole extraction material included in the buffer layer 15.

A method for manufacturing the aforementioned quantum dot device 10 includes forming a first electrode 11 on a substrate (not shown), forming a second charge auxiliary layer 16, forming a light emitting layer 13, forming a buffer layer 15, forming a first charge auxiliary layer 14, and forming a second electrode 12.

The light emitting layer 13, the first and second charge auxiliary layers 14 and 16, the buffer layer 15, or a combination thereof may be formed by a solution process, for example, spin coating, slit coating, inkjet printing, nozzle printing, spraying, doctor blade coating, or a combination thereof, but is not limited thereto.

At least a portion of each process of the forming of the light emitting layer 13, the first and second charge auxiliary layers 14 and 16, the buffer layer 15, or a combination thereof may further include optionally drying, heat treating, or a combination thereof after the solution process, and the heat-treating may be performed, for example, at about 50° C. to about 300° C. for about 1 minute to about 10 hours, but the present disclosure is not limited thereto.

The aforementioned quantum dot device 10 may be applied to various electronic devices such as, for example, a display device or a lighting device. For example, the aforementioned quantum dot device 10 may be applied to various electronic devices requiring light emission, for example, may be applied to various electronic devices such as a display device such as a television (TV), a monitor, a computer, a mobile phone, etc., or a lighting device such as a light source.

Hereinafter, the embodiments are illustrated in more detail with reference to examples. However, these examples are exemplary, and the scope of claims is not limited thereto.

Synthesis of Quantum Dot Dispersion

Synthesis Example 1: Synthesis of Blue Light Emitting Quantum Dots 1

(1) Synthesis of ZnTeSe Core Quantum Dot Dispersion

Selenium (Se) and tellurium (Te) are respectively dispersed in trioctylphosphine (TOP) to obtain a 2 molar (moles per liter (M)) Se/TOP stock solution and a 0.1 M Te/TOP stock solution.

An amount of 0.125 millimoles (mmol) of zinc acetate, 0.25 mmol of oleic acid, 0.25 mmol of hexadecylamine, and 10 milliliters (mL) of trioctylamine are added to a reactor and then, heated under vacuum at 120° C. After 1 hour, an atmosphere in the reactor is converted into nitrogen.

After heating the reactor to 240° C., the Se/TOP stock solution and the Te/TOP stock solution in a Te:Se mole ratio of 1:25 are rapidly injected thereinto. The reaction solution is heated up to 300° C., maintained for 30 minutes, and then, rapidly cooled down to room temperature, acetone is added thereto, and precipitates obtained therefrom through centrifugation are dispersed in toluene to obtain ZnTeSe core quantum dot dispersion.

(2) Synthesis of ZnTeSe Core/ZnSeS Shell Quantum Dot Dispersion

Trioctylamine is added to a 10 mL flask. Subsequently, 0.6 mmol of zinc acetate and 1.2 mmol of oleic acid are added thereto and then, vacuum-treated at 120° C. for 10 minutes. Then, the flask is internally substituted with nitrogen ($N_2$), the ZnTeSe core quantum dot dispersion is rapidly injected thereinto, and the 2 M Se/TOP stock solution and a 1 M S/TOP stock solution obtained by dispersing sulfur (S) in trioctylphosphine (TOP) in a Se:S mole ratio of 1.2:2.8 are injected thereinto and then, heated up to 340° C. to perform a reaction. When the reaction is complete, the reactor is cooled down, the obtained nanocrystals are centrifuged with ethanol and then, dispersed in toluene to obtain ZnTeSe core/ZnSeS shell quantum dot dispersion.

Synthesis Example 2: Synthesis of Blue Light Emitting Quantum Dots 2

Zinc chloride is dissolved in ethanol to obtain a solution of zinc chloride having a concentration of 10 weight percent (wt %). An amount of 0.01 mL of the zinc chloride solution is added to the ZnTeSe core/ZnSeS shell quantum dot dispersion according to Synthesis Example 1 and then, stirred at 60° C. for 30 minutes to perform a surface exchange reaction. After the reaction, ethanol is added thereto to induce precipitation, which is followed by centrifugation, and this process is several times repeated to obtain halogenated ZnTeSe core/ZnSeS shell quantum dot dispersion.

Synthesis of Inorganic Nanoparticles

Synthesis Example 3

An amount of 0.93 mmol of magnesium acetate tetrahydrate, 8.07 mmol of zinc acetate dihydrate, and 90 mL of dimethylsulfoxide are added to a reactor and heated at 60° C. in the air. Subsequently, 15 mmol of tetramethylammonium hydroxide pentahydrate is dissolved in 30 mL of ethanol and then, added dropwise to the reactor by 3 mL per minute. After stirring the mixture for 1 hour, the obtained $Zn_{0.85}Mg_{0.15}O$ nanoparticles and ethyl acetate are centrifuged in a volume ratio of 1:9 and dispersed in ethanol at a concentration of 1 wt % to obtain $Zn_{0.85}Mg_{0.15}O$ nanoparticle dispersion (9.6 mg/ml). When measured with an UT F30 Tecnai electron microscope, the $Zn_{0.85}Mg_{0.15}O$ nanoparticles have an average particle diameter size of about 3.0 nanometers (nm).

Preparation of Dispersion for Electron Auxiliary Layer (First Charge Auxiliary Layer)

Preparation Example 1

An amount of 0.06 milligrams (mg) of $Rb_2CO_3$ is added to 6 mL of ethanol and then, stirred overnight (6 hours or more) to prepare a $Rb_2CO_3$ solution (at a concentration of 0.01 milligrams per milliliter (mg/mL)). Subsequently, the $Zn_{0.85}Mg_{0.15}O$ nanoparticle dispersion obtained in Synthesis Example 3 and the $Rb_2CO_3$ solution are mixed in a volume ratio of 5:1 to prepare dispersion for an electron auxiliary layer.

Preparation of Dispersion for Buffer Layer

Preparation Example 2

N2,N7-di(naphthalen-1-yl)-9,9-dioctyl-N2,N7-diphenyl-9H-fluorene-2,7-diamine (NPB, a hole extraction material) is dissolved in ethanol at a concentration of 2 mg/mL, preparing an NPB solution. Subsequently, 3.73 mL of the $Zn_{0.85}Mg_{0.15}O$ nanoparticle dispersion according to Synthesis Example 3 and 0.27 mL of the NPB solution are mixed to prepare dispersion for a buffer layer. In the dispersion for the buffer layer, the weight concentration of NPB is 1.5 wt % based on a total amount of $Zn_{0.85}Mg_{0.15}O$ nanoparticles and NPB.

Preparation Example 3

Dispersion for a buffer layer is prepared according to the same method as Preparation Example 2 except that 3.48 mL of the $Zn_{0.85}Mg_{0.15}O$ nanoparticle dispersion according to Synthesis Example 3 and 0.52 mL of the NPB solution are mixed. In the dispersion for the buffer layer, the weight concentration of NPB is 3 wt % based on a total amount of $Zn_{0.85}Mg_{0.15}O$ nanoparticles and NPB.

Preparation Example 4

Dispersion for a buffer layer is prepared according to the same method as Preparation Example 2 except that 3.19 mL of the $Zn_{0.85}Mg_{0.15}O$ nanoparticle dispersion according to Synthesis Example 3 and 0.81 mL of the NPB solution are mixed. In the dispersion for the buffer layer, the weight concentration of NPB is 5 wt % based on a total amount of $Zn_{0.85}Mg_{0.15}O$ nanoparticles and NPB.

Preparation Example 5

Dispersion for a buffer layer is prepared according to the same method as Preparation Example 2 except that 3.06 mL of the $Zn_{0.85}Mg_{0.15}O$ nanoparticle dispersion according to Synthesis Example 3 and 0.94 mL of the NPB solution are mixed. In the dispersion for the buffer layer, the weight concentration of NPB is 6 wt % based on a total amount of $Zn_{0.85}Mg_{0.15}O$ nanoparticles and NPB.

Manufacture of Thin Film

Thin film samples are formed to evaluate energy levels of the synthesized and prepared materials.

Preparation Example 6

The dispersion for an electron auxiliary layer according to Preparation Example 1 is spin-coated on a Si substrate and then, heat-treated at 80° C. for 30 minutes to form a 30 nm-thickness thin film.

Preparation Example 7

A solution prepared by dissolving the hole extraction material used in Preparation Examples 2 to 5 in ethanol at a concentration of 3 wt % is spin-coated on a Si substrate and then, heat-treating it at 80° C. for 30 minutes to form a 30 nm-thickness thin film.

Evaluation I

The thin films according to Preparation Examples 6 and 7 are evaluated with respect to highest occupied molecular orbital (HOMO) energy levels through an ultraviolet (UV) photoelectron spectroscopy (UPS, Versaprobe, Physical Electronics, Inc.) analysis. A lowest unoccupied molecular orbital (LUMO) energy level is calculated through a band-gap energy obtained from an absorption peak of the spectrum of the UPS analysis and a HOMO energy level.

The results are shown in Table 1.

TABLE 1

| | HOMO energy level (electronvolts (eV)) | LUMO energy level (eV) |
|---|---|---|
| Preparation Example 6 | 7.40 | 3.41 |
| Preparation Example 7 | 5.2 | 2.4 |

Manufacture of Blue Light Emitting Quantum Dot Device I

Example 1

A glass substrate deposited with 100 nm-thick indium tin oxide (ITO) (Work Function (WF): 4.8 electronvolts (eV), a first electrode) is surface-treated with UV-ozone for 15 minutes, spin-coated with a poly(3,4-ethylenedioxythiophene) polystyrene sulfonate (PEDOT:PSS) solution (H. C. Starks), heat-treated under an air atmosphere at 150° C. for 10 minutes, and heat-treated again under an $N_2$ atmosphere at 150° C. for 30 minutes to form a 30 nm-thick lower hole transport layer (HOMO: 5.3 eV, LUMO: 2.7 eV). Subsequently, a poly[(9,9-dioctylfluorenyl-2,7-diyl-co-(4,4'-(N-4-butylphenyl)diphenylamine] solution (TFB) (Sumitomo Corp.) is spin-coated on the lower hole auxiliary layer, and heat-treated at 150° C. for 30 minutes to form a 25 nm-thick upper hole auxiliary layer (HOMO: 5.6 eV, LUMO: 2.69 eV). Subsequently, the halogenated ZnTeSe/ZnSeS core-shell quantum dot dispersion according to Synthesis Example 2 (a peak emission wavelength: 453 nm) is spin-coated on the upper hole auxiliary layer, and heat-treated at 80° C. for 30 minutes to form a 28 nm-thick quantum dot layer (light emitting layer) (HOMO: 5.9 eV, LUMO: 3.2 eV). Subsequently, the dispersion for a buffer layer according to Preparation Example 2 is spin-coated on the quantum dot layer, and heat-treated at 80° C. for 30 minutes to form a 5 nm-thick buffer layer. Subsequently, the dispersion for an electron auxiliary layer according to Preparation Example 1 is spin-coated on the buffer layer, and heat-treated at 80° C. for 30 minutes to form a 15 nm-thick electron auxiliary layer. Subsequently, aluminum (Al) is vacuum-deposited on the electron auxiliary layer to form a 100 nm-thick second electrode (WF: 4.2 eV), manufacturing a quantum dot device.

Example 2

A quantum dot device is manufactured according to the same method as Example 1 except that the dispersion for a buffer layer according to Preparation Example 3 instead of the dispersion for a buffer layer according to Preparation Example 2 is used to form a buffer layer.

Example 3

A quantum dot device is manufactured according to the same method as Example 1 except that the dispersion for a buffer layer according to Preparation Example 4 instead of the dispersion for a buffer layer according to Preparation Example 2 is used to form a buffer layer.

Comparative Example 1

A quantum dot device is manufactured according to the same method as Example 1 except that the buffer layer is not formed.

Evaluation II

Life-span characteristics of the quantum dot devices of Examples 1 to 3 and Comparative Example 1 are evaluated.

The life-span characteristics are evaluated by using decreased luminance from initial luminance, while injecting a current to meet a condition under which the quantum dot devices exhibit luminance of 650 nit (candelas per square meter), and $T_{90}$ is relatively evaluated by measuring time that the quantum dot devices exhibit 90% of initial luminance and using that of Comparative Example 1 as a reference (ref.).

The results are shown in Table 2.

TABLE 2

| | $T_{90}$ |
|---|---|
| Example 1 | 1.23 |
| Example 2 | 1.22 |
| Example 3 | 1.64 |
| Comparative Example 1 | 1.00 (ref.) |

Referring to Table 2, the quantum dot devices of Examples 1-3 exhibit improved life-span characteristics, compared with the quantum dot device of Comparative Example 1.

Manufacture of Blue Light Emitting Quantum Dot Device II

Example 4

A glass substrate deposited with a 100 nm-thick ITO (WF: 4.8 eV, a first electrode) is surface-treated with UV-ozone for 15 minutes, spin-coated with a PEDOT:PSS solution (H.C. Starks, Inc.), heat-treated under an air atmosphere at 150° C. for 10 minutes, and heat-treated again under a $N_2$ atmosphere at 150° C. for 30 minutes to form a 30 nm-thick lower hole transport layer (HOMO: 5.3 eV, LUMO: 2.7 eV). Subsequently, a poly[(9,9-dioctylfluorenyl-2,7-diyl-co-(4,4'-(N-4-butylphenyl)diphenylamine] solution (TFB) (Sumitomo Corp.) is spin-coated on the lower hole auxiliary layer, and heat-treated at 150° C. for 30 minutes to from a 25 nm-thick upper hole auxiliary layer (HOMO: 5.6 eV, LUMO: 2.69 eV). On the upper hole auxiliary layer, the halogenated ZnTeSe/ZnSeS core-shell quantum dot dispersion (a peak emission wavelength: 453 nm) according to Synthesis Example 2 is spin-coated and heat-treated at 80° C. for 30 minutes to form a 28 nm-thick lower quantum dot layer (lower light emitting layer) (HOMO: 5.9 eV, LUMO:

3.2 eV). Subsequently, on the lower quantum dot layer, the (halogenated) ZnTeSe/ZnSeS core-shell quantum dot dispersion according to Synthesis Example 2 is spin-coated and heat-treated at 80° C. for 30 minutes to form a 13 nm-thick upper quantum dot layer (upper light emitting layer). On the upper quantum dot layer, the dispersion for a buffer layer according to Preparation Example 5 is spin-coated and heat-treated at 80° C. for 30 minutes to form a 5 nm-thick buffer layer. Subsequently, on the buffer layer, the dispersion for an electron auxiliary layer according to Preparation Example 1 is spin-coated and heat-treated at 80° C. for 30 minutes to form a 15 nm-thick electron auxiliary layer. On the electron auxiliary layer, aluminum (Al) is vacuum-deposited to form a 100 nm-thick second electrode (WF: 4.2 eV), manufacturing a quantum dot device.

Example 5

A quantum dot device is manufactured according to the same method as Example 4 except that a 10 nm-thick electron auxiliary layer is formed instead of the 15 nm-thick electron auxiliary layer.

Comparative Example 2

A quantum dot device is manufactured according to the same method as Example 4 except that except that the buffer layer is not formed.

Comparative Example 3

A quantum dot device is manufactured according to the same method as Example 5 except that except that the buffer layer is not formed.

Evaluation III

Luminance and Life-span characteristics of the quantum dot devices of Examples 4 and 5 and Comparative Examples 2 and 3 are evaluated.

The luminance characteristics are evaluated using spectroradiometer CS-2000 (Konica Monolta).

The life-span characteristics are evaluated by using decreased luminance from initial luminance, while injecting a current to meet a condition under which the quantum dot devices exhibit luminance of 650 nit, and $T_{90}$ is relatively evaluated by measuring time that the quantum dot devices exhibit 90% of initial luminance and using that of Comparative Examples 2 and 3 as a reference (ref.), respectively.

The results are shown in Table 3.

TABLE 3

| | $Lum_{max}$ ($Cd/m^2$) | $T_{90}$ |
|---|---|---|
| Example 4 | 57743 | 1.20 |
| Comparative Example 2 | 54870 | 1.00 (ref.) |
| Example 5 | 56574 | 1.45 |
| Comparative Example 3 | 51194 | 1.00 (ref.) |

* $Lum_{max}$ ($Cd/m^2$): Maximum Luminance (candelas per square meter ($cd/m^2$))

Referring to Table 3, the quantum dot devices of Examples 4 and 5 exhibit improved luminance and life-span characteristics, compared with the quantum dot device of Comparative Examples 2 and 3, respectively.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. A quantum dot device, comprising
a first electrode and a second electrode,
a light emitting layer between the first electrode and the second electrode, the light emitting layer comprising quantum dots,
a first charge auxiliary layer between the second electrode and the light emitting layer, the first charge auxiliary layer configured to enhance transport of first charge carriers from the second electrode to the light emitting layer, and
a buffer layer between the light emitting layer and the first charge auxiliary layer,
wherein the buffer layer comprises a first charge auxiliary material configured to enhance transport of the first charge carriers and a second charge auxiliary material configured to enhance extraction of the second charge carriers, and a highest occupied molecular orbital energy level of the second charge auxiliary material is lower than a highest occupied molecular orbital energy level of the first charge auxiliary material.

2. The quantum dot device of claim 1, wherein
one of the first charge carriers and the second charge carriers is electrons, and
the other of the first charge carriers and the second charge carriers is a hole,
the first charge carriers are major charge carriers between the second electrode and the light emitting layer, and
the second charge carriers are minor charge carriers between the second electrode and the light emitting layer.

3. The quantum dot device of claim 1, wherein the buffer layer is in contact with the light emitting layer.

4. The quantum dot device of claim 1, wherein the first charge auxiliary layer and the buffer layer are in contact with each other.

5. The quantum dot device of claim 1, wherein the highest occupied molecular orbital energy level of the second charge auxiliary material is about 0.1 electronvolts to about 3.0 electronvolts lower than the highest occupied molecular orbital energy level of the first charge auxiliary material.

6. The quantum dot device of claim 1, wherein
the first charge auxiliary material is a first electron transport material, and
the second charge auxiliary material is a hole extraction material.

7. The quantum dot device of claim 6, wherein
the first charge auxiliary material comprises n-type inorganic nanoparticles, and
the second charge auxiliary material comprises a p-type non-polymer, a p-type polymer, a p-type inorganic material, a p-type organic-inorganic material, or a combination thereof.

8. The quantum dot device of claim 6, wherein a conductivity of the second charge carriers of the second charge auxiliary material is greater than a conductivity of the second charge carriers of the first charge auxiliary material.

9. The quantum dot device of claim 6, wherein the first charge auxiliary layer comprises a second electron transport material that is the same as or different from the first electron transport material.

10. The quantum dot device of claim 1, wherein the second charge auxiliary material is present in a lesser amount than the first charge auxiliary material in the buffer layer.

11. The quantum dot device of claim 10, wherein in the buffer layer, the second charge auxiliary material is present in an amount of about 0.1 weight percent to about 15 weight percent, based on a total amount of the first charge auxiliary material and the second charge auxiliary material.

12. The quantum dot device of claim 1, wherein a thickness of the buffer layer is the same as or thinner than a thickness of the first charge auxiliary layer.

13. The quantum dot device of claim 1, wherein a conductivity of the second charge carriers of the buffer layer is greater than a conductivity of the second charge carriers of the first charge auxiliary layer, and a conductivity of the second charge carriers of the buffer layer is greater than a conductivity of the second charge carriers of the light emitting layer.

14. The quantum dot device of claim 1, further comprising a second charge auxiliary layer between the first electrode and the light emitting layer, the second charge auxiliary layer configured to enhance transport of the second charge carriers from the first electrode to the light emitting layer, wherein the second charge carriers are major charge carriers between the first electrode and the light emitting layer.

15. An electronic device comprising the quantum dot device of claim 1.

16. A quantum dot device, comprising a first electrode and a second electrode, a light emitting layer between the first electrode and the second electrode, the light emitting layer comprising quantum dots, a buffer layer between the second electrode and the light emitting layer, the buffer layer comprising a first electron transport material and a hole extraction material, and a first charge auxiliary layer between the second electrode and the light emitting layer, the first charge auxiliary layer comprising a second electron transport material that is the same as or different from the first electron transport material, wherein the buffer layer is closer to the light emitting layer than is the first charge auxiliary layer.

17. The quantum dot device of claim 16, wherein the hole extraction material is present in a lesser amount than the first electron transport material in the buffer layer.

18. The quantum dot device of claim 16, wherein the first electron transport material, the hole extraction material, the second electron transport material, or a combination thereof comprises inorganic nanoparticles.

19. The quantum dot device of claim 16, wherein a hole conductivity of the buffer layer is greater than a hole conductivity of the first charge auxiliary layer, and a hole conductivity of the buffer layer is greater than a hole conductivity of the light emitting layer.

20. The quantum dot device of claim 16, further comprising a second charge auxiliary layer between the first electrode and the light emitting layer, the second charge auxiliary layer comprising a hole transport material.

21. An electronic device comprising the quantum dot device of claim 16.

22. A quantum dot device, comprising a first electrode and a second electrode, a light emitting layer between the first electrode and the second electrode, the light emitting layer comprising quantum dots, a first charge auxiliary layer between the second electrode and the light emitting layer, the first charge auxiliary layer being an electron auxiliary layer, and a buffer layer between the light emitting layer and the first charge auxiliary layer, wherein a hole conductivity of the buffer layer is greater than a hole conductivity of the first charge auxiliary layer, wherein a hole conductivity of the buffer layer is greater than a conductivity of the light emitting layer, and wherein the first electrode is an anode, the second electrode is a cathode, and the buffer layer comprises a hole extraction material.

23. The quantum dot device of claim 22, wherein the buffer layer further comprises n-type inorganic nanoparticles.

24. The quantum dot device of claim 22, wherein the first charge auxiliary layer and the buffer layer each comprise the same or different n-type inorganic nanoparticles.

25. An electronic device comprising the quantum dot device of claim 22.

26. A quantum dot device, comprising a first electrode and a second electrode, a light emitting layer between the first electrode and the second electrode, the light emitting layer comprising quantum dots, a charge auxiliary layer between the second electrode and the light emitting layer, the charge auxiliary layer comprising an alkali metal compound and metal oxide nanoparticles comprising zinc, and a buffer layer between the light emitting layer and the charge auxiliary layer, the buffer layer comprising the metal oxide nanoparticles comprising zinc and a hole extraction material selected from a p-type non-polymer, a p-type polymer, a p-type inorganic material, a p-type organic-inorganic material, or a combination thereof.

* * * * *